US012455509B2

(12) United States Patent
Wang

(10) Patent No.: US 12,455,509 B2
(45) Date of Patent: Oct. 28, 2025

(54) SEMICONDUCTOR STRUCTURE AND SYSTEM FOR MANUFACTURING THE SAME

(71) Applicant: NANYA TECHNOLOGY CORPORATION, New Taipei (TW)

(72) Inventor: Cheng-Wei Wang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 815 days.

(21) Appl. No.: 17/679,311

(22) Filed: Feb. 24, 2022

(65) Prior Publication Data

US 2023/0266676 A1   Aug. 24, 2023

(51) Int. Cl.
*G03F 7/00* (2006.01)
*H01L 23/544* (2006.01)

(52) U.S. Cl.
CPC ...... *G03F 7/70633* (2013.01); *G03F 7/70683* (2013.01); *H01L 23/544* (2013.01)

(58) Field of Classification Search
CPC ............... G03F 7/2004; G03F 7/70633; G03F 7/70681; G03F 7/70683; G03F 7/706843;
(Continued)

(56) References Cited

U.S. PATENT DOCUMENTS 8,455,982 B2 * 6/2013 Chen .................. G03F 7/70633
257/797

8,625,096 B2 * 1/2014 Sewell .................. G03F 9/708
430/30
(Continued)

FOREIGN PATENT DOCUMENTS

KR    20070077692 A  *  7/2007
KR    20080062732 A  *  7/2008
(Continued)

OTHER PUBLICATIONS

Maas, Diedrek et al., "Real-time focus and overlay measurement by the use of fluorescent markers," Metrology, Inspection, and Process Control for Microlithography XXVIII, Proc. of SPIE vol. 9050, pp. 90502W-1 to 90502W-8. (Year: 2014).*
(Continued)

*Primary Examiner* — Gordon J Stock, Jr.
(74) *Attorney, Agent, or Firm* — Xuan Zhang

(57) ABSTRACT

The present disclosure provides a semiconductor structure and a system for manufacturing the semiconductor structure. The system includes a fabrication equipment, configured to perform operations to form a layer on a wafer; an exposure equipment, configured to perform patterning operations to form a pattern of the layer; and an alignment equipment, configured to detect an alignment of two overlay marks at different elevations on the wafer. The alignment equipment includes a stage, configured to support the wafer; an optical device, configured to emit a radiation to excite a photoluminescent material of one of the two overlay marks; an optical filter, configured to receive and filter a radiation emitted from the photoluminescent material; and an optical detector, configured to convert an optical signal filtered by the optical filter to an electrical signal.

8 Claims, 23 Drawing Sheets

(58) Field of Classification Search
CPC ......... G03F 7/706849; G03F 7/706851; H01L 23/544; G01B 11/14; G01B 11/254
See application file for complete search history.

(56) References Cited

U.S. PATENT DOCUMENTS

| | | | | |
|---|---|---|---|---|
| 12,125,800 | B2* | 10/2024 | Wei | .................... H01L 23/5226 |
| 12,243,832 | B2* | 3/2025 | Wei | .................... G03F 7/70683 |
| 12,369,439 | B2* | 7/2025 | Wei | .................... H10H 20/8512 |
| 12,394,677 | B2* | 8/2025 | Lin | ................. G03F 7/706851 |
| 2003/0211409 | A1 | 11/2003 | Nunes | |
| 2004/0195572 | A1 | 10/2004 | Kato et al. | |
| 2007/0212652 | A1 | 9/2007 | Lalbahadoersing et al. | |
| 2008/0212097 | A1* | 9/2008 | Mos | .................... G03F 7/70633 356/400 |
| 2009/0009741 | A1 | 1/2009 | Okita et al. | |
| 2012/0229786 | A1* | 9/2012 | Engelen | .............. G03F 7/70091 355/67 |
| 2018/0292326 | A1* | 10/2018 | Manassen | ............ G01B 11/272 |
| 2019/0041329 | A1* | 2/2019 | Hill | ....................... G02B 27/286 |
| 2020/0241428 | A1* | 7/2020 | Marciano | ............ G03F 7/70491 |
| 2022/0050386 | A1* | 2/2022 | Devilliers | ............ G03F 7/70633 |
| 2023/0266660 | A1* | 8/2023 | Wang | .................... H01L 23/544 430/5 |
| 2023/0359129 | A1* | 11/2023 | Madsen | .............. G03F 7/70633 |
| 2024/0071842 | A1* | 2/2024 | Lin | ....................... G03F 9/7084 |

FOREIGN PATENT DOCUMENTS

| | | | | |
|---|---|---|---|---|
| TW | 201502467 | A | 1/2015 | |
| TW | 201839505 | A | 11/2018 | |
| TW | 201937297 | A | 9/2019 | |
| TW | 202028874 | A | 8/2020 | |
| TW | 202138595 | A | 10/2021 | |
| TW | 202142832 | A | 11/2021 | |
| TW | 202202829 | A | 1/2022 | |
| TW | 202230700 | A | 8/2022 | |
| WO | WO-03075099 | A2 * | 9/2003 | ......... G03F 7/70633 |
| WO | WO-2013085389 | A2 * | 6/2013 | .......... G03F 9/7065 |
| WO | WO2013047003 | A1 | 3/2015 | |
| WO | WO2021042502 | A1 | 3/2021 | |

OTHER PUBLICATIONS

Office Action with the search report mailed on Sep. 30, 2022 related to Taiwanese Application No. 111123043.
Office Action with the search report mailed on Feb. 2, 2024 related to Taiwanese Application No. 111123040.

* cited by examiner

SEMICONDUCTOR STRUCTURE AND SYSTEM FOR MANUFACTURING THE SAME

TECHNICAL FIELD

The present disclosure relates to a semiconductor structure, and a system of manufacturing the semiconductor structure. Particularly, the present disclosure relates to a semiconductor structure having an air gap, and a system of manufacturing the semiconductor structure.

DISCUSSION OF THE BACKGROUND

As the semiconductor industry develops, reducing overlay errors in photoresist patterns and underlying patterns in lithography operations becomes increasingly important. Since correctly measuring overlay errors has become more difficult due to various factors such as asymmetric shapes of measurement structures, a new overlay mark and a method which can more precisely determine overlay errors are required.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of forming a semiconductor structure. The method includes forming a first pattern over a substrate; forming a photoluminescent layer on the first pattern; forming an intermediate layer over the photoluminescent layer and the substrate; forming a patterned mask layer on the intermediate layer; and detecting an alignment of the patterned mask layer with the first pattern.

In some embodiments, the method further includes: transferring a pattern of the patterned mask layer to the intermediate layer.

In some embodiments, the photoluminescent layer includes phosphor, quantum dot, nano materials or a combination thereof.

In some embodiments, the nano materials include $Gd_2O_2S:R$, wherein R represents $Eu^{3+}$, $Pr^{3+}$ or $Tb^{3+}$.

In some embodiments, the photoluminescent layer is formed by one or more of deposition, sputtering, doping and coating.

In some embodiments, the photoluminescent layer is exposed through the patterned mask layer from a top view perspective.

In some embodiments, the first pattern is surrounded by at least a portion of the patterned mask layer from the top view perspective.

In some embodiments, the first pattern is encircled by at least a portion of the patterned mask layer from the top view perspective.

In some embodiments, the detecting of the alignment comprises: providing a first optical signal on the photoluminescent layer; receiving a second optical signal from the photoluminescent layer; filtering the second optical signal; and converting the second optical signal to a first electrical signal.

In some embodiments, the detecting of the alignment comprises: providing a third optical signal on the patterned mask layer; receiving a fourth optical signal from the patterned mask layer; and converting the fourth optical signal to a second electrical signal.

In some embodiments, the first electrical signal and the second electrical signal are processed to indicate the alignment of the patterned mask layer with the photoluminescent layer.

In some embodiments, the intermediate layer includes one or more dielectric materials.

In some embodiments, the first pattern is formed adjacent to a capacitor.

In some embodiments, the capacitor is formed at a same elevation as the first pattern.

In some embodiments, a height of the capacitor is greater than a thickness of the first pattern.

In some embodiments, a thickness of a first portion of the intermediate layer over the capacitor is less than a thickness of a second portion of the intermediate layer over the first pattern.

In some embodiments, the formation of the patterned mask layer includes: disposing a photoresist layer over the intermediate layer; and removing portions of the photoresist layer to form the patterned mask layer.

In some embodiments, a thickness of a first portion of the photoresist layer over the capacitor is less than a thickness of a second portion of the photoresist layer over the first pattern.

In some embodiments, a distance between a top of the patterned mask layer and a top of the first pattern is greater than 5.7 microns.

Another aspect of the present disclosure provides a system for forming a semiconductor structure. The system includes: a fabrication equipment, configured to perform operations to form a layer on a wafer; an exposure equipment, configured to perform patterning operations to form a pattern of the layer; and an alignment equipment, configured to detect an alignment of two overlay marks at different elevations. The alignment equipment comprises: a stage, configured to support a semiconductor structure; an optical device, configured to emit a radiation to excite a photoluminescent material of an overlay mark in a scribe line region of the semiconductor structure; an optical filter, configured to receive and filter a radiation emitted from the photoluminescent material; and an optical detector, configured to convert an optical signal filtered by the optical filter to an electrical signal.

In some embodiments, the alignment equipment is configured to generate an alignment result of the two overlay marks.

In some embodiments, the alignment equipment further includes: a controller, electrically or wirelessly connected to the optical device and the optical detector, and configured to process the electrical signal from the optical detector.

In some embodiments, the alignment equipment further includes: an interface, electrically connected to the controller and configured to display a result of the electrical signal after the electrical signal is processed by the controller.

In some embodiments, the optical filter includes a grating structure for the radiation entering through.

In some embodiments, a filtration range of wavelengths of the optical filter is different from a range of wavelengths of radiations emitted from the optical device.

In some embodiments, the optical detector is electrically or physically connected to the optical filter.

In some embodiments, the optical device emits a radiation having a wavelength in a range of near infrared (NIR), far infrared (FIR), ultraviolet (UV), near UV (NUV), far UV (FUV), green light, yellow light, red light, or a combination thereof.

In some embodiments, the system further includes a network, wirelessly or electrically connected to the fabrication equipment, the exposure equipment and the alignment equipment.

In some embodiments, the system further includes another controller, electrically or wirelessly connected to the fabrication equipment, the exposure equipment and the alignment equipment.

In some embodiments, the controller is configured to generate an alignment result based on the electrical signal from the optical detector.

Another aspect of the present disclosure provides a semiconductor structure. The semiconductor structure includes: a capacitor, disposed over a substrate; an overlay mark, disposed adjacent to and at a same elevation as the capacitor; a photoluminescent layer, disposed on the overlay mark; and an intermediate layer, disposed over the capacitor and the photoluminescent layer.

In some embodiments, the overlay mark is in contact with the capacitor.

In some embodiments, a height of the capacitor is greater than a thickness of the overlay mark.

In some embodiments, the photoluminescent layer includes phosphor, quantum dot, $Gd_2O_2S:R$, or a combination thereof, wherein R represents $Eu^{3+}$, $Pr^{3+}$ or $Tb^{3+}$.

In some embodiments, a thickness of a first portion of the intermediate layer over the capacitor is less than a thickness of a second portion of the intermediate layer over the photoluminescent layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
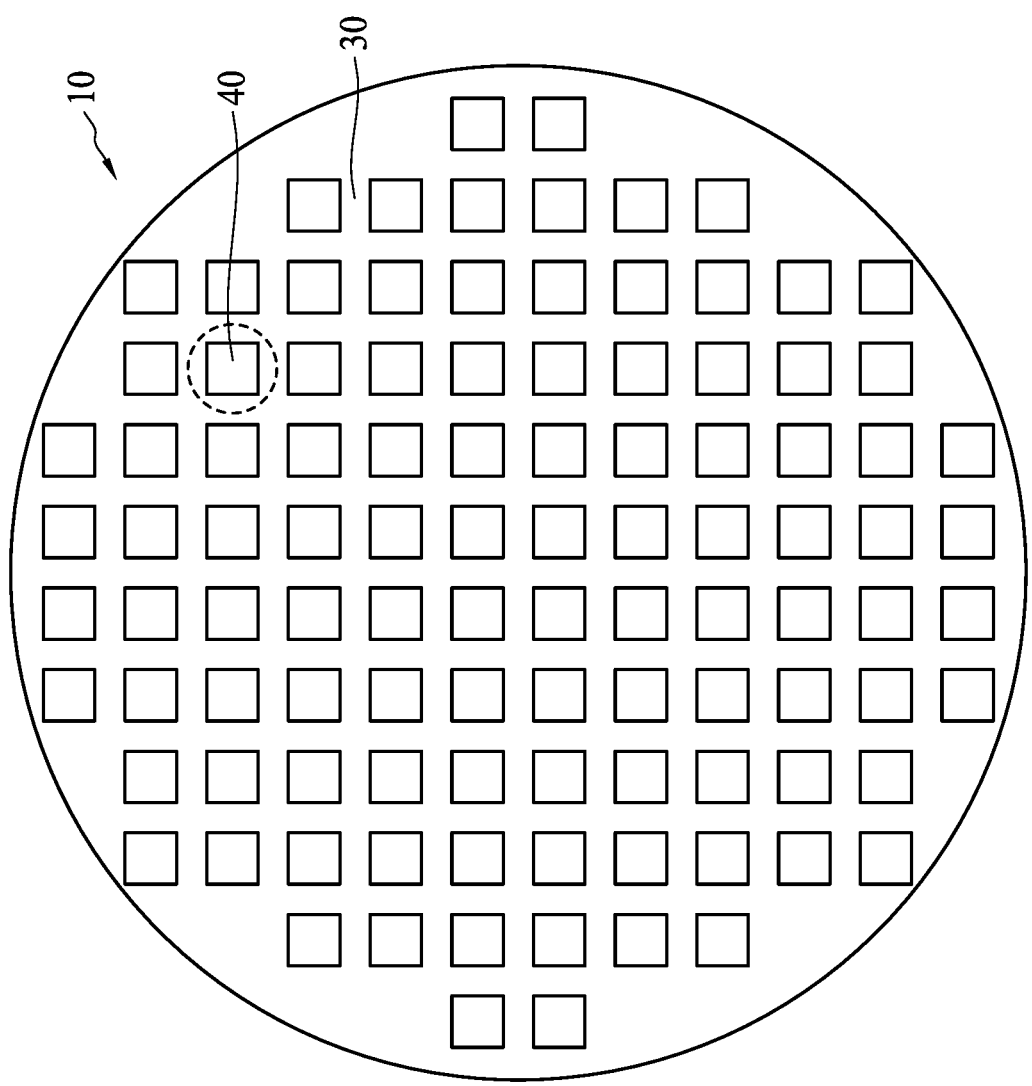
FIG. 1 is a schematic top view of a wafer in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
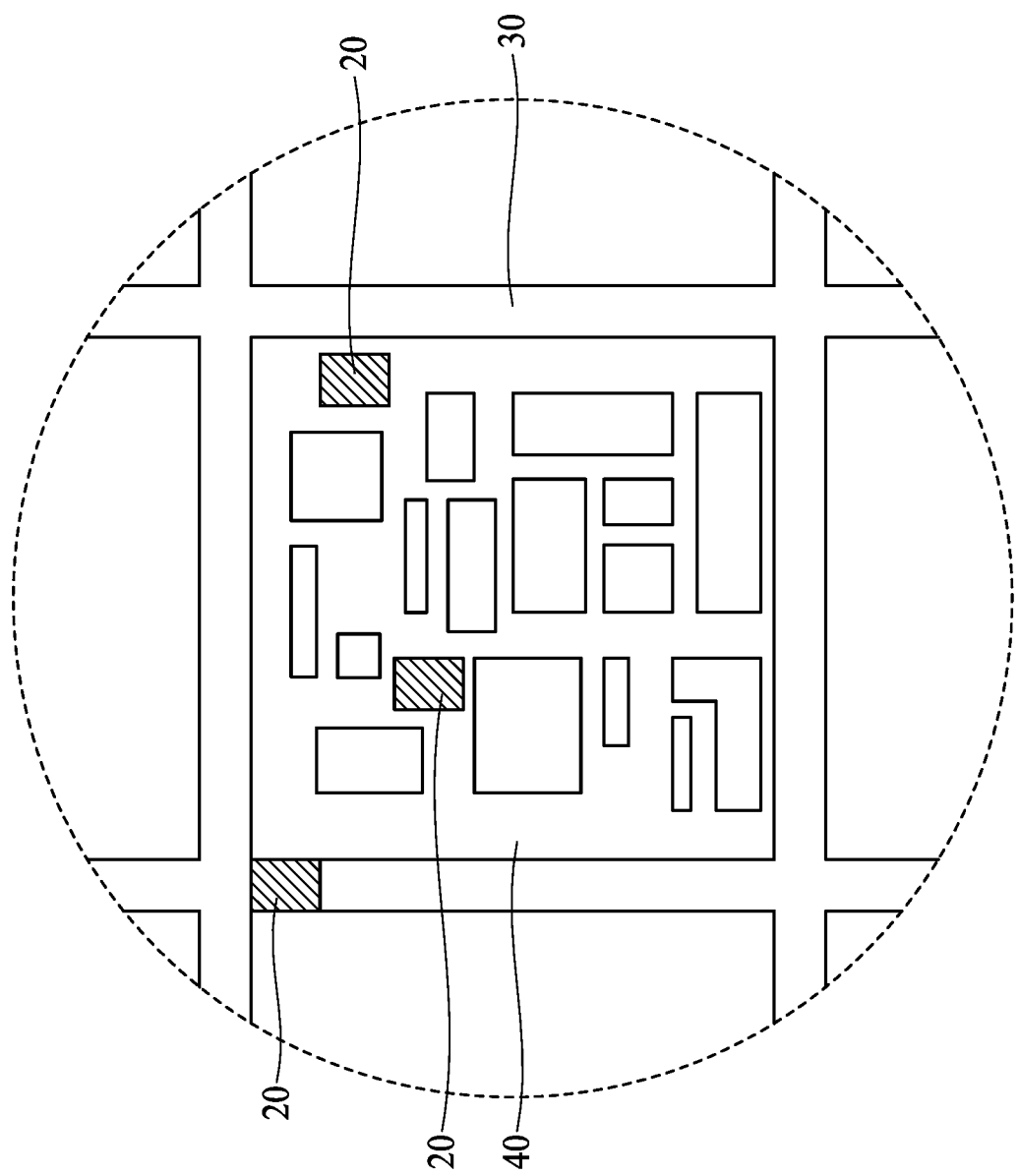
FIG. 2 is an enlarged schematic diagram of a dotted region as shown in FIG. 1 in accordance with some embodiments of the present disclosure.

Referring to FIG. 1 and FIG. 2, FIG. 1 is a top view of a wafer 10 according to various aspects of the present disclosure, and FIG. 2 is an enlarged top view of a dotted region in FIG. 1.

As shown in FIG. 1 and FIG. 2, the wafer 10 includes a plurality of device regions 40 and a scribe line region 30 surrounding each of the device regions 40. The device regions 40 may be separated by the scribe line region 30. In some embodiments, the plurality of device regions 40 define a plurality of dies. In some embodiments, the scribe line region 30 defines a plurality of scribe lines between the plurality of dies. For ease of illustration, the device regions 40 can be also referred to as dies 40, and the scribe line region 30 can be also referred to as scribe lines 30. The wafer 10 may be sawed along the scribe lines 30 into the plurality of dies 40. Each of the dies 40 may include semiconductor devices, which can include active components and/or passive components. The active components may include a memory die (e.g., a dynamic random-access memory (DRAM) die, a static random-access memory (SRAM) die, etc.), a power management die (e.g., a power management integrated circuit (PMIC) die), a logic die (e.g., a system-on-a-chip (SoC), a central processing unit (CPU), a graphics processing unit (GPU), an application processor (AP), a microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. The passive components may include a capacitor, a resistor, an inductor, a fuse or other passive components.

In some embodiments, an overlay mark 20 can be located on the scribe lines 30. In some embodiments, the overlay mark 20 can be disposed at a corner of an edge of each of the dies 40 on the scribe lines 30. In some embodiments, the overlay mark 20 can be located inside the dies 40. The overlay marks 20 can be used to determine whether a current layer (or an upper layer) is precisely aligned with a pre-layer (or a lower layer) during a semiconductor fabrication process, for example by determining whether an opening of a photoresist layer or a pattern of the photoresist layer is aligned with the pre-layer. The pre-layer can be located at a vertical level different from a vertical level of the current layer. In some embodiments, the current layer is disposed at an elevation higher than an elevation of the pre-layer.

Figure 3:
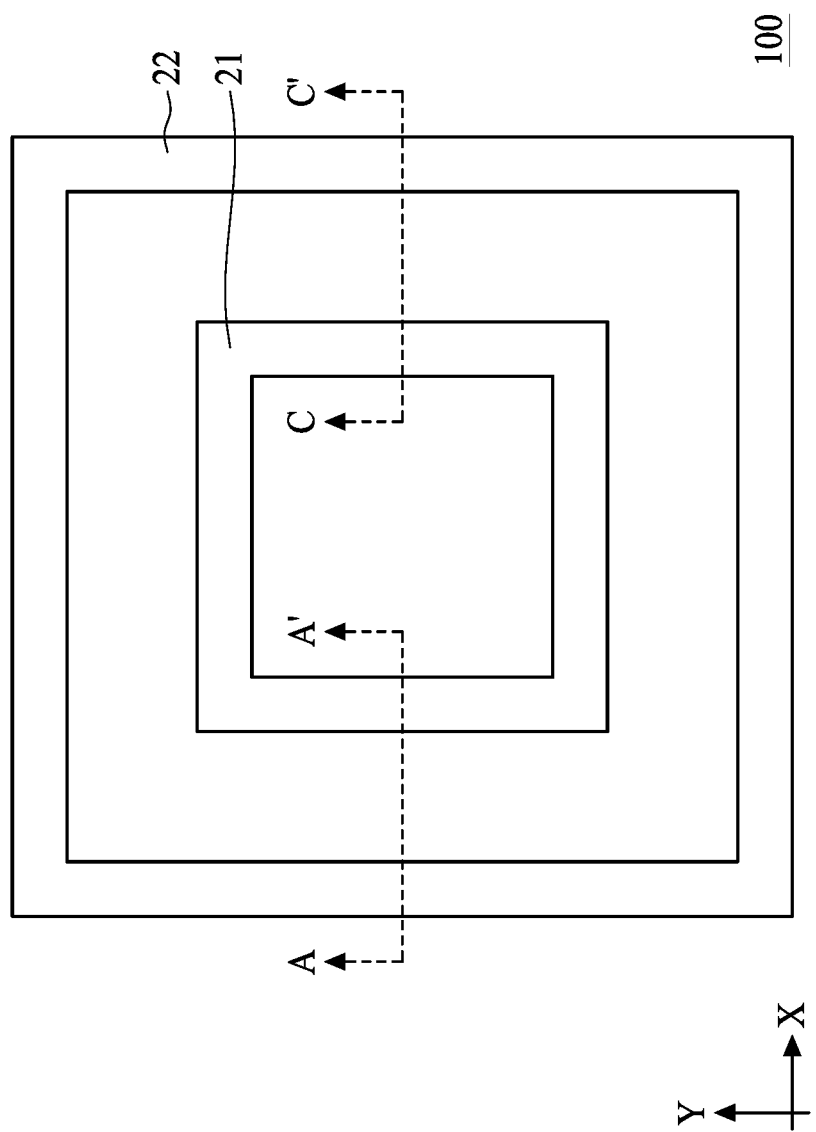
FIGS. 3 to 4 are schematic top views of overlay marks at different elevations in accordance with different embodiments of the present disclosure.
Figure 4:
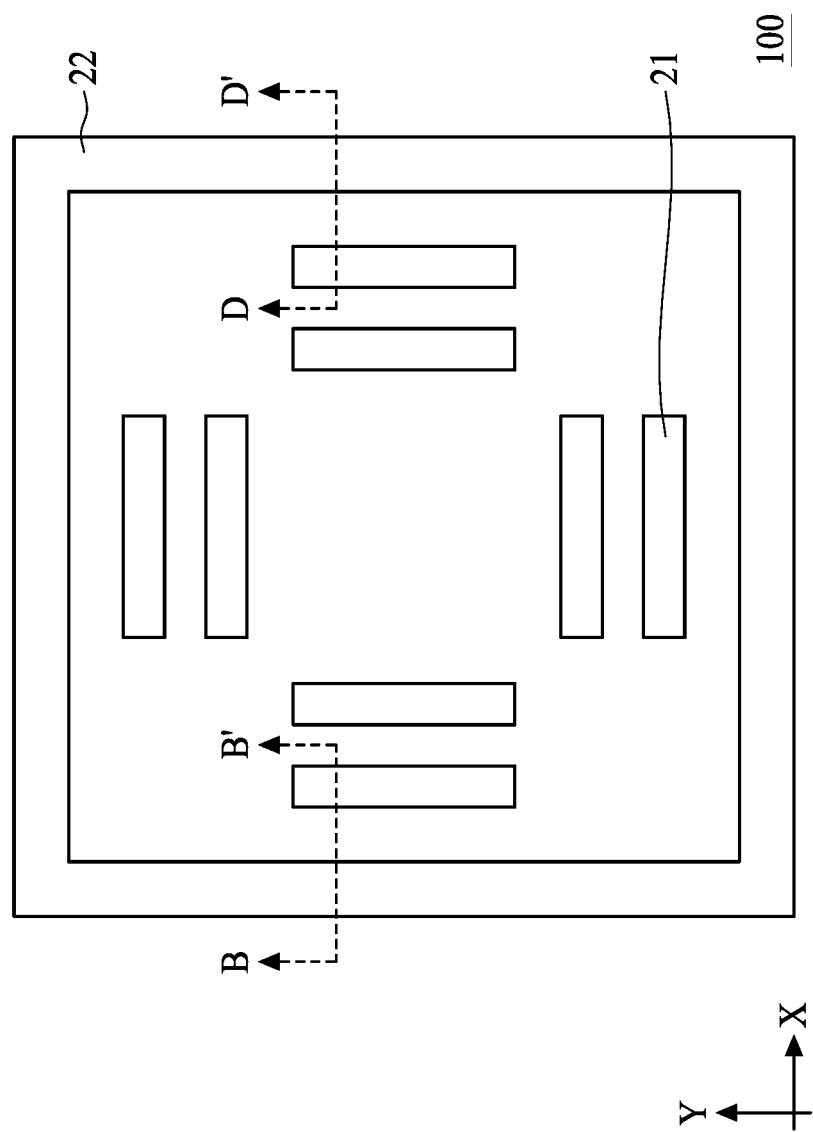

FIG. 3 and FIG. 4 are top views showing alignment of an overlay mark 21 of the pre-layer and an overlay mark 22 of the current layer over a substrate 100 according to different embodiments of the present disclosure. The overlay mark 22 can surround or encircle the overlay mark 21 from the top view as shown in FIG. 3 or FIG. 4. In some embodiments, the overlay mark 21 is a square enclosure from the top view as shown in FIG. 3. In some embodiments, the overlay mark 21 includes a plurality of portions as shown in FIG. 4. In some embodiments, the portions of the overlay mark 21 are separated from each other. The overlay mark 21 may include at least an x-axis aligned portion and a y-axis aligned portion from the top view to indicate alignment along the x-axis and alignment along the y-axis with the overlay mark 22. In some embodiments, the overlay mark includes portions extending along the x-axis direction and portions extending along the y-axis direction as shown in FIG. 4.

In some embodiments, the wafer 10 includes the substrate 100. The substrate 100 may be a semiconductor substrate, such as a bulk semiconductor, a semiconductor-on-insulator (SOI) substrate, or the like. The substrate 100 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient Si:Ge feature. In another embodiment, the SiGe alloy is formed over a silicon substrate. In some embodiments, the SiGe alloy can be mechanically strained by another material in contact with the SiGe alloy. In some embodiments, the substrate 100 may have a multilayer structure, or the substrate 100 may include a multilayer compound semiconductor structure. In some embodiments, the substrate 100 includes semiconductor devices, electrical components, electrical elements or a combination thereof. In some embodiments, the substrate 100 includes transistors or functional units of transistors.

Figure 5:
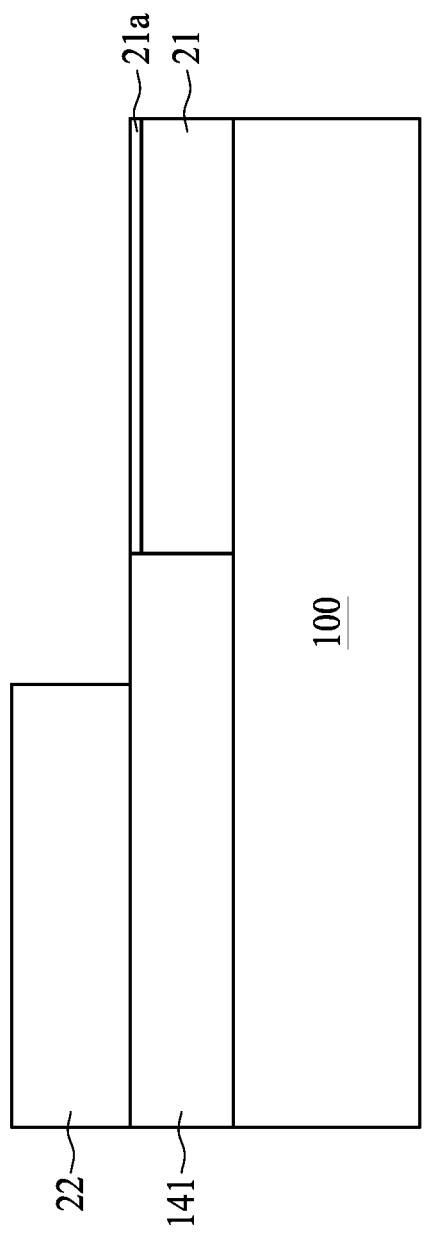
FIG. 5 is a schematic cross-sectional diagram along a cutting line A-A' in FIG. 3 or a cutting line B-B' in FIG. 4 in accordance with some embodiments of the present disclosure.

FIG. 5 is a cross-sectional view taken along a cutting line A-A' of FIG. 3 or a cutting line B-B' of FIG. 4 in accordance with some embodiments of the present disclosure. As shown in FIG. 3 5, the overlay mark 21 can be disposed on the substrate 100. The overlay mark 21 can be disposed in an intermediate layer 141. The overlay mark 21 can indicate a position of a pattern of the pre-layer or the lower layer disposed in the intermediate layer 141. A photoluminescent layer 21a can be disposed on a top of the overlay mark 21. In some embodiments, the photoluminescent layer 21a is a layer formed over the overlay mark 21. In some embodiments, the photoluminescent layer 21a is a sublayer formed at the top of the overlay mark 21. The photoluminescent layer 21a includes photoluminescent or fluorescent materials, and can provide a better view of the overlay mark 21, allowing an alignment between the overlay mark 21 and the overlay mark 22 to be easily examined. In some embodiments, the photoluminescent layer 21a includes one or more inorganic materials. In some embodiments, the photoluminescent layer 21a includes one or more of phosphor, quantum dot and nano materials. In some embodiments, the nano materials include $Gd_2O_2S:R$, wherein R represents $Eu^{3+}$, $Pr^{3+}$ or $Tb^{3+}$.

In some embodiments, the overlay mark 21 may include a material same as a material of an isolation structure. In some embodiments, the overlay mark 21 may be disposed at an elevation same as an elevation of the isolation structure. The isolation structure can include, for example, a shallow trench isolation (STI), a field oxide (FOX) feature, a local oxidation of silicon (LOCOS) feature, and/or other suitable isolation elements. The isolation structure can include a dielectric material such as silicon oxide, silicon nitride, silicon oxy-nitride, fluorosilicate glass (FSG), a low-k dielectric material, combinations thereof, and/or other suitable materials.

In some embodiments, the overlay mark 21 can include a material same as a material of a gate structure. The gate structure can be sacrificial, for example, such as a dummy gate structure. In some embodiments, the overlay mark 21 can be disposed at an elevation same as an elevation of the gate structure. In some embodiments, the overlay mark 21 can include a dielectric layer that includes a same material as a material of a gate dielectric layer and a conductive layer that includes a same material as a material of a gate electrode layer.

In some embodiments, the gate dielectric layer can include silicon oxide (SiO$_x$), silicon nitride (Si$_x$N$_y$), silicon oxynitride (SiON), or a combination thereof. In some embodiments, the gate dielectric layer can include dielectric material(s), such as a high-k dielectric material. The high-k dielectric material may have a dielectric constant (k value) greater than 4. The high-k dielectric material may include hafnium oxide (HfO$_2$), zirconium oxide (ZrO$_2$), lanthanum oxide (La$_2$O$_3$), yttrium oxide (Y$_2$O$_3$), aluminum oxide (Al$_2$O$_3$), titanium oxide (TiO$_2$) or another applicable material. Other suitable materials are within the contemplated scope of this disclosure.

In some embodiments, the gate electrode layer can include a polysilicon layer. In some embodiments, the gate electrode layer can be made of a conductive material, such as aluminum (Al), copper (Cu), tungsten (W), titanium (Ti), tantalum (Ta), or other applicable materials. In some embodiments, the gate electrode layer can include a work function layer. The work function layer is made of a metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure. The gate electrode layer can be formed by low-pressure chemical vapor deposition (LPCVD) and plasma-enhanced CVD (PECVD).

In some embodiments, the overlay mark 21 can include a material same as a material of a conductive via, which can be disposed on a conductive trace, such as the first metal layer (M1 layer) of an interconnect structure. In some embodiments, the overlay mark 21 can include a material same as a material of the conductive trace, and the conductive trace can be disposed in a dielectric layer and electrically connected to the conductive via. In some embodiments, the conductive trace and the conductive via are disposed in an interconnection structure disposed over the transistors of the substrate 100. In some embodiments, the conductive trace and the conductive via are disposed in a redistribution layer (RDL) disposed over the interconnection structure over the substrate 100. In such embodiments, the overlay mark 21 can include a barrier layer and a conductive layer surrounded by the barrier layer. The barrier layer can include metal nitride or other suitable materials. The conductive layer can include metals, such as W, Ta, Ti, Ni, Co, Hf, Ru, Zr, Zn, Fe, Sn, Al, Cu, Ag, Mo, Cr, alloy or other suitable materials. In such embodiments, the overlay mark 21 can be formed by suitable deposition processes such as, for example, sputtering and physical vapor deposition (PVD).

The intermediate layer 141 can include insulating material, such as silicon oxide or silicon nitride. In some embodiments, the intermediate layer 141 can include conductive material, such as metal or alloy. In some embodiments, the intermediate layer 141 can be formed by a suitable film-forming method, such as chemical vapor deposition (CVD), atomic layer deposition (ALD) or physical vapor deposition (PVD). After the intermediate layer 141 is formed, a thermal operation, such as rapid thermal annealing, can be performed. In some embodiments, a planarization operation, such as a chemical mechanical polishing (CMP) operation, is performed. In some embodiments, a removal operation, such as an etching process, can be performed. The etching process can include, for example, a dry etching process or a wet etching process. It should be noted that additional operations can be provided before, during, and after the processes set forth above, and some of the operations described above can be replaced or eliminated, for additional embodiments of the method. The order of the operations/processes are interchangeable.

In some embodiments, the overlay mark 22 is formed over the intermediate layer 141. In some embodiments, the overlay mark 22 is in physical contact with the intermediate layer 141. The overlay mark 22 can indicate an alignment of the current layer (or an upper layer) with the intermediate layer 141. In some embodiments, the overlay mark 22 is a portion of the current layer in the scribe line 30. A material of the overlay mark 22 can be similar to or same as the material of the overlay mark 21, and repeated description is omitted herein. In some embodiments, the current layer is directly over the intermediate layer 141, and the overlay mark 22 is on the intermediate layer 141. In some embodiments, the overlay mark 22 is designed to indicate an alignment of the upper layer with the intermediate layer 141. In some embodiments, the upper layer is disposed over and separated from the intermediate layer 141.

Figure 6:
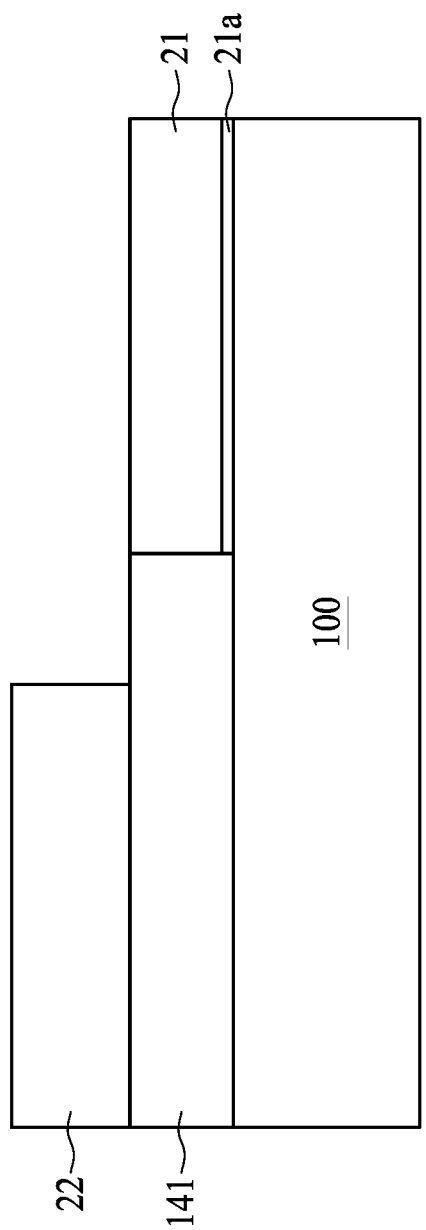
FIG. 6 is a schematic cross-sectional diagram along a cutting line A-A' in FIG. 3 or a cutting line B-B' in FIG. 4 in accordance with some embodiments of the present disclosure.

FIG. 6 is a cross-sectional view taken along the cutting line A-A' of FIG. 3 or the cutting line B-B' of FIG. 4 in accordance with another embodiment of the present disclosure. The overlay mark 21 shown in FIG. 6 is similar to the overlay mark 21 shown in FIG. 5 except the photoluminescent layer 21a is at a bottom of the overlay mark 21. In some embodiments, the photoluminescent layer 21a is a layer formed prior to the formation of the overlay mark 21. In some embodiments, the photoluminescent layer 21a is considered a sublayer of the overlay mark 21.

Figure 7:
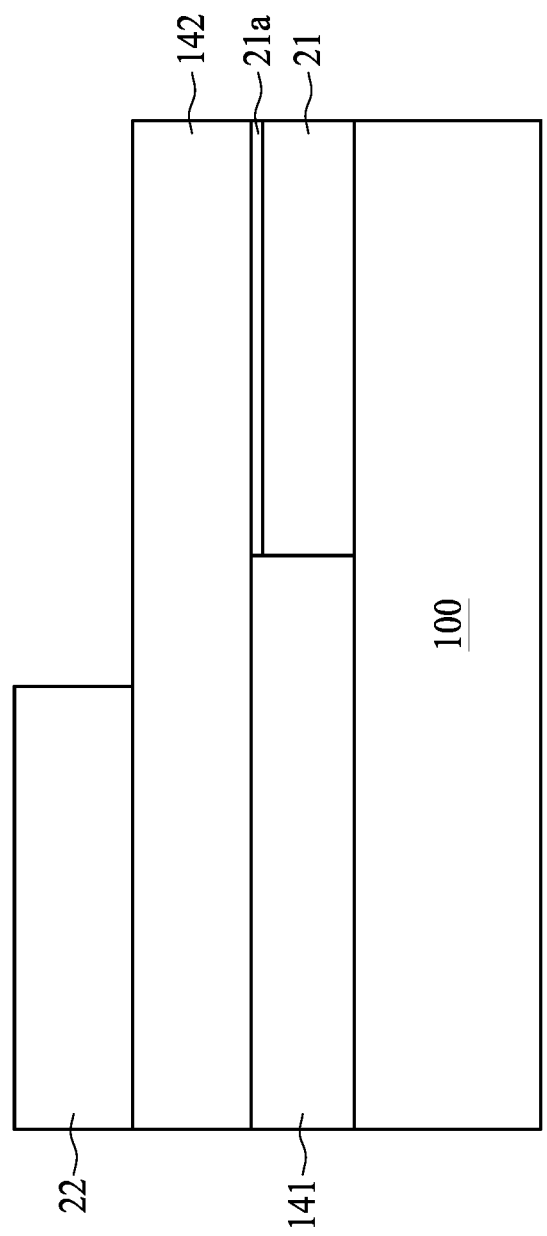
FIG. 7 is a schematic cross-sectional diagram along a cutting line A-A' in FIG. 3 or a cutting line B-B' in FIG. 4 in accordance with some embodiments of the present disclosure.

FIG. 7 is a cross-sectional view taken along the cutting line A-A' of FIG. 3 or the cutting line B-B' of FIG. 4 in accordance with another embodiment of the present disclosure. In some embodiments, an intermediate layer 142 is disposed over the overlay mark 21 and the intermediate layer 141. In some embodiments, the intermediate layer 142 is in physical contact with the overlay mark 21 and the intermediate layer 141. A material and/or a forming method of the intermediate layer 142 can be similar to or same as those of the intermediate layer 141, and repeated description is omitted herein. In some embodiments, the overlay mark 22 is disposed over the intermediate layer 142. The overlay mark 22 can be separated from the intermediate layer 141 by the intermediate layer 142. The overlay mark 22 can be disposed one or more layers above the overlay mark 21 and the intermediate layer 141, with any number of intermediate layers 142 disposed therebetween; the disclosure is not limited to only one intermediate layer 142.

Figure 8:
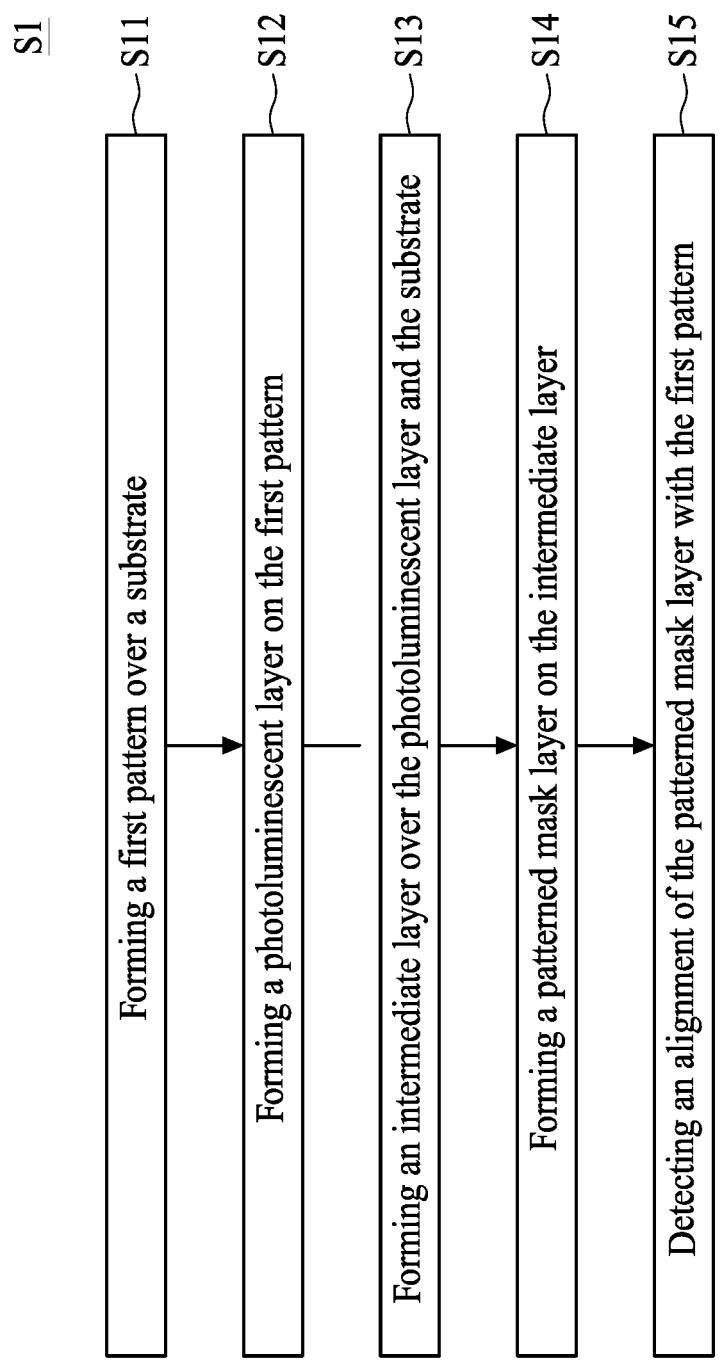
FIG. 8 is a flow diagram illustrating a method for manufacturing a semiconductor structure in accordance with some embodiments of the present disclosure.

FIG. 8 is a flow diagram of a method S1 for manufacturing a semiconductor structure in accordance with some embodiments of the present disclosure. The method Si includes: (S11) forming a first pattern over a substrate; (S12) forming a photoluminescent layer on the first pattern; (S13) forming an intermediate layer over the first photoluminescent layer and the substrate; (S14) forming a patterned mask layer on the intermediate layer; and (S15) detecting an alignment of the patterned mask layer with the first pattern.

Figure 9:
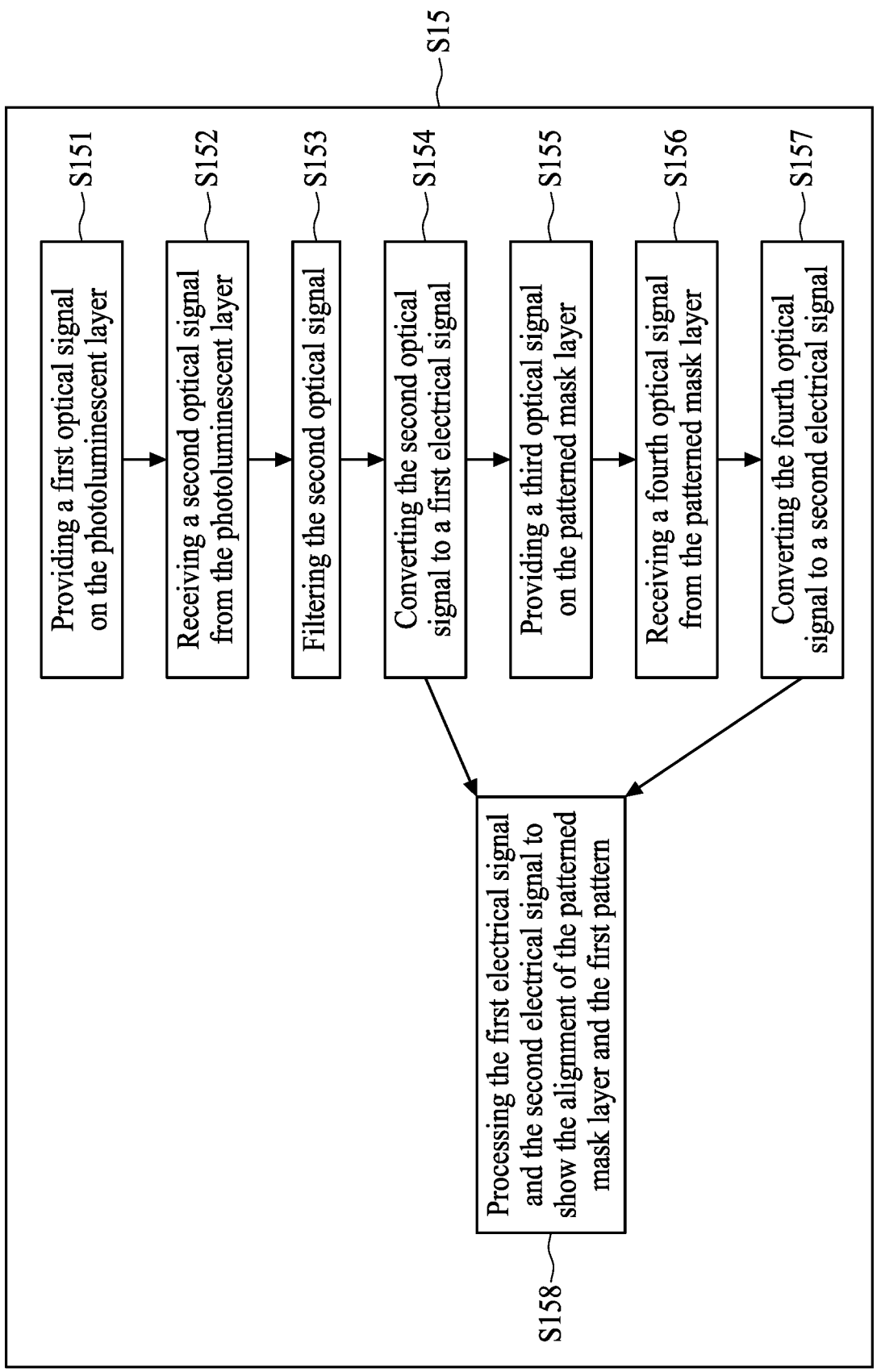
FIG. 9 is a flow diagram illustrating an operation of the method in FIG. 8 in accordance with some embodiments of the present disclosure.

FIG. 9 is a flow diagram of the operation S15 in accordance with some embodiments of the present disclosure. In some embodiments, the operation S15 includes several steps: (S151) providing a first optical signal on the photoluminescent layer; (S152) receiving a second optical signal from the photoluminescent layer; (S153) filtering the second optical signal; (S154) converting the second optical signal to a first electrical signal; (S155) providing a third optical signal on the patterned mask layer; (S156) receiving a fourth optical signal from the patterned mask layer; (S157) converting the fourth optical signal to a second electrical signal; and (S158) processing the first electrical signal and the second electrical signal to determine the alignment of the patterned mask layer with the first pattern.

The method S1 includes a number of operations and steps and the description and illustration are not deemed as a limitation to the sequence of the operations and the steps. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

Figure 10:
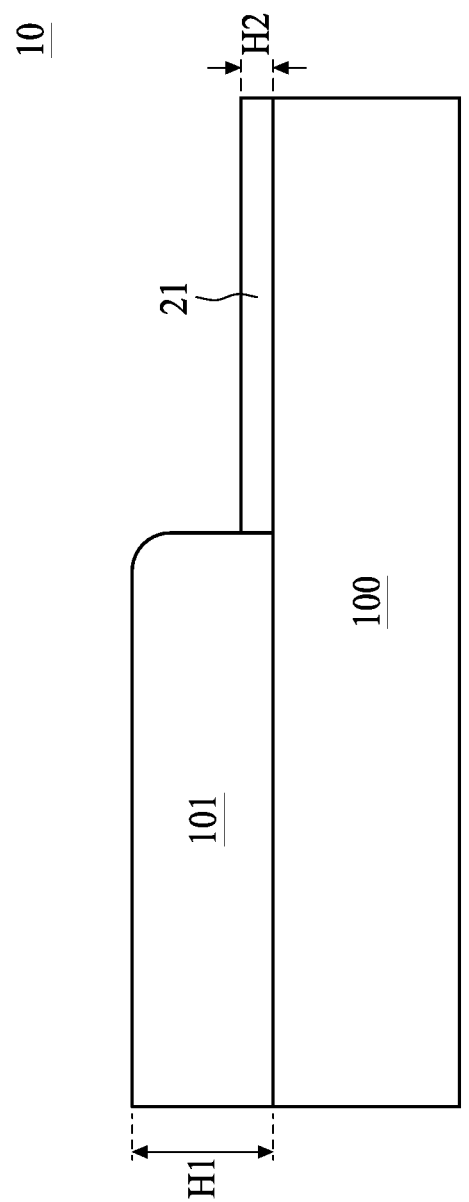
FIGS. 10 to 20 are cross-sectional diagrams of intermediate stages in the formation of a semiconductor structure in accordance with some embodiments of the present disclosure.

FIG. 10 is a cross-sectional diagram at a stage of the method S1 in accordance with some embodiments of the present disclosure. In the operation S11, a substrate 100 is provided on a wafer 10, and a first pattern 21 is formed over the substrate 100. In some embodiments, the first pattern 21 is formed in a scribe line region 30. In some embodiments, the first pattern 21 is formed in a device region 40. One or more electrical components 101 may be formed over the substrate 100. The electrical component can be an active component or a passive component. Examples of the active components or the passive components can include those illustrated above, and repetition is omitted herein. In some embodiments, the electrical component 101 is a capacitor. In some embodiments, a height H1 of the electrical component 101 is different from a thickness H2 of the first pattern 21. In some embodiments, the height H1 of the electrical component 101 is greater than the thickness H2 of the first pattern 21. In some embodiments, the height H1 is in a range of 0.5 to 3 microns. In some embodiments, the height H1 is in a range of 1 to 2 microns. In some embodiments, the thickness H2 is in a range of 0.1 to 1 microns. In some embodiments, the first pattern 21 and the electrical component 101 are disposed at a same elevation over the substrate 100. In some embodiments, a bottom surface of the first pattern 21 and a bottom surface of the electrical component 101 are coplanar. In some embodiments, the first pattern 21 is adjacent to the electrical component 101. In some embodiments, the first pattern 21 is directly adjacent to the electrical component 101. In some embodiments, the electrical component 101 is formed in the device region 40. In some embodiments, the electrical component 101 is formed at periphery of the device region 40. In some embodiments, the electrical component 101 is formed in the scribe line region 30 for electrical examination. In some embodiments, the first pattern 21 is referred to as an overlay mark.

Figure 11:
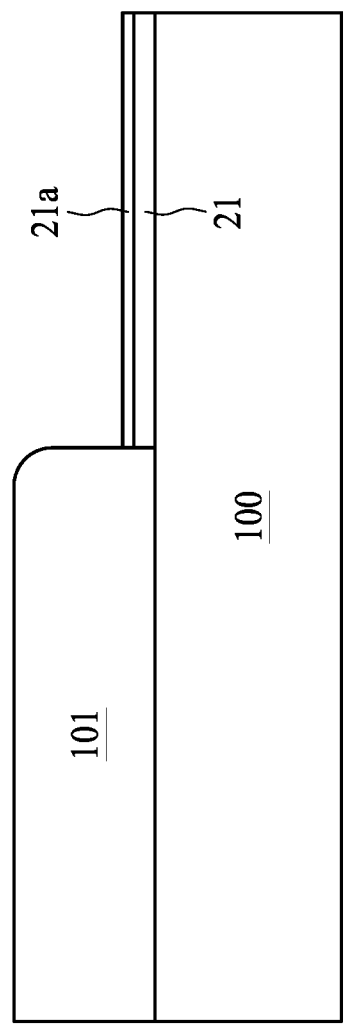

FIG. 11 is a cross-sectional diagram at a different stage of the method S1 in accordance with some embodiments of the present disclosure. In the operation S12, a photoluminescent layer 21a is formed on the first pattern 21. In some embodiments, the photoluminescent layer 21a is formed only in the scribe line region 30. In some embodiments, the photoluminescent layer 21a is formed only on the first pattern 21. In some embodiments, the photoluminescent layer 21a overlaps the first pattern 21. In some embodiments, the photoluminescent layer 21a entirely overlaps the first pattern 21.

In some embodiments, the photoluminescent layer 21a includes one or more inorganic materials. In some embodiments, the photoluminescent layer 21a includes one or more of phosphor, quantum dot and nano materials. In some embodiments, the nano materials includes $Gd_2O_2S:R$, wherein R represents $Eu^{3+}$, $Pr^{3+}$ or $Tb^{3+}$.

In some embodiments, the photoluminescent layer 21a is formed by sputtering, coating and/or deposition, and is formed over the first pattern 21. In such embodiments, a total thickness of the first pattern 21 and the photoluminescent layer 21a is greater than the thickness H2. In some embodiments, the photoluminescent layer 21a is formed by doping, and is formed at a top of the first pattern 21 as shown in FIG. 11. In such embodiments, the total thickness of the first pattern 21 and the photoluminescent layer 21a is substantially equal to the thickness H2.

In some embodiments, the photoluminescent layer 21a is formed over the substrate 100 prior to the formation of the first pattern 21 to form an arrangement similar to that shown in FIG. 6. In such embodiments, the photoluminescent layer 21a is formed by sputtering, coating and/or deposition. In some embodiments, the photoluminescent layer 21a is patterned together with the first pattern 21, and the photoluminescent layer 21a can be entirely overlapped by the first pattern 21.

Figure 12:
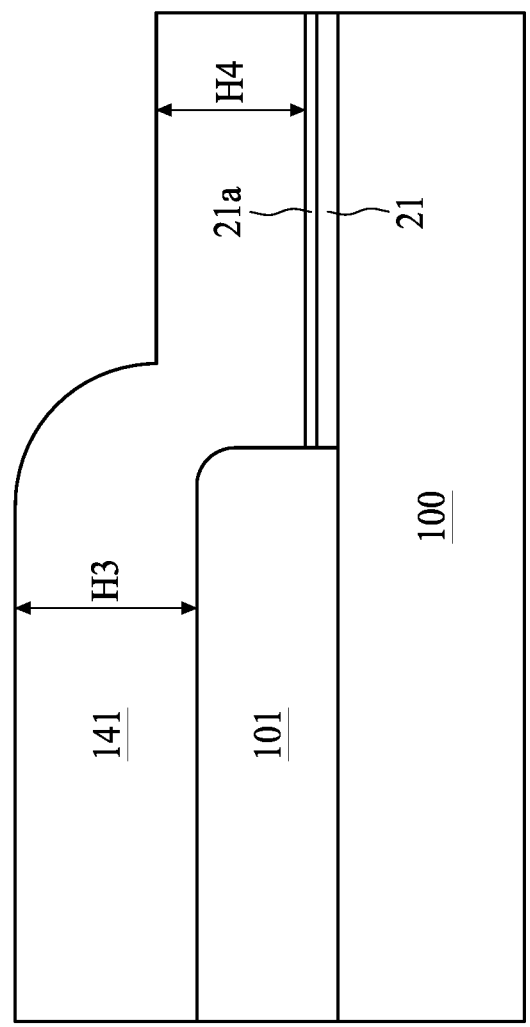

FIG. 12 is a cross-sectional diagram at a different stage of the method S1 in accordance with some embodiments of the present disclosure. In the operation S13, an intermediate layer 141 is formed over the photoluminescent layer 21a, the first pattern 21 and the substrate 100. In some embodiments, the intermediate layer 141 is a dielectric layer of the interconnection structure for providing electrical isolation between different electric paths of the interconnection structure. In some embodiments, the dielectric layer includes dielectric materials similar to or same as dielectric materials of the isolation structure described above. In some embodiments, the intermediate layer 141 is formed by deposition. In some embodiments, the intermediate layer 141 includes oxide and is formed by a deposition with a temperature over 350 degrees Celsius (° C.). In some embodiments, the temperature of the deposition is in a range of 350° C. to 375° C. In some embodiments, photoluminescent or fluorescent material of the photoluminescent layer 21a is stable under a temperature substantially equal to or greater than 375° C.

In some embodiments, a conformal deposition is performed to form the intermediate layer 141. A profile of the intermediate layer 141 may be conformal to a profile of the electrical component 101 and the first pattern 21. In some embodiments, different portions of the intermediate layer 141 at different elevations may have different thicknesses due to a property of the deposition. In some embodiments, a thickness H3 of a first portion of the intermediate layer 141 disposed over the electrical component 101 is substantially greater than a thickness H4 of a second portion of the intermediate layer 141 disposed over the first pattern 21. In some embodiments, an overall thickness of the intermediate layer 141 is in a range of 1.5 to 3 microns. In some embodiments, the overall thickness of the intermediate layer 141 is in a range of 2 to 3 microns.

Figure 13:
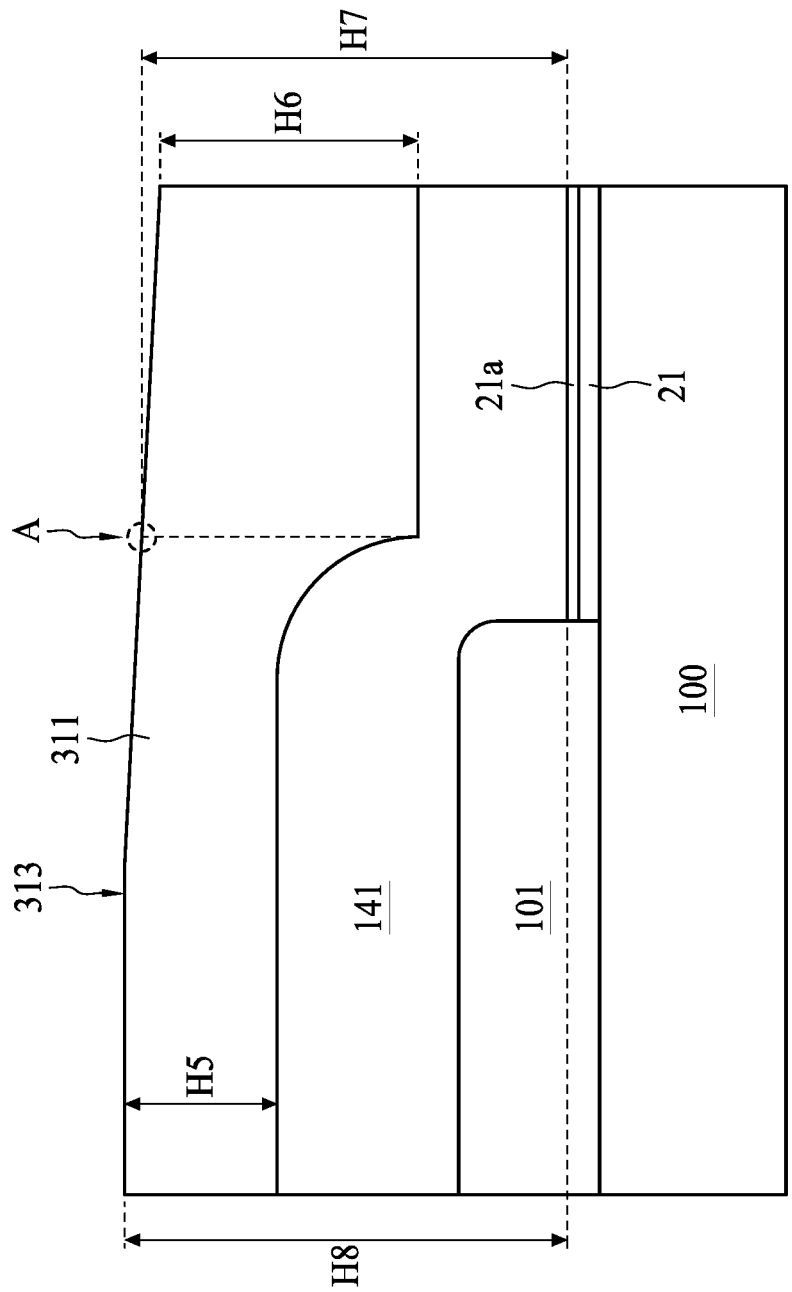

FIG. 13 is a cross-sectional diagram at a different stage of the method S1 in accordance with some embodiments of the present disclosure. Prior to the operation S14, a mask layer 311 is formed over the intermediate layer 141. In some embodiments, the mask layer 311 includes photosensitive materials. In some embodiments, the mask layer 311 is a photoresist layer. In some embodiments, a top surface 313 of the mask layer 311 is substantially a planar surface. In some embodiments, the top surface 313 of the mask layer 311 includes a tilted portion as shown in FIG. 13 due to different thicknesses of the electrical component 101 and the first pattern 21. In some embodiments, a thickness H5 of a first portion of the mask layer 311 over the electrical component 101 is less than a thickness H6 of a second portion of the mask layer 311 over the first pattern 21. In some embodiments, the thickness H5 is in a range of 1.5 to 2.5 microns. In some embodiments, the thickness H6 is in a range of 2.5 to 3.5 microns.

In some embodiments, a distance H7 measured between a point A and a top surface of the first pattern 21 is greater than 5.7 microns, wherein the point A is at the top surface 313 over the first pattern 21 at a position of greatest thickness of the mask layer 311. In some embodiments, a distance H8 is slightly greater than the distance H7, wherein the distance H8 is measured between a top of the first portion of the mask layer 311 over the electrical component 101 and the top surface of the first pattern 21. In some embodiments, the difference between the distance H8 and the distance H7 is negligible and can be ignored.

Subsequently, the mask layer 311 is patterned in the operation S14 of the method S1 to form a patterned mask layer. A pattern of the patterned layer can function as an overlay mark of a current layer for alignment detection performed in the operation S15.

Conventionally, an examination of an alignment of the current layer and a pre-layer depends purely on reflection of a traditional overlay mark. A top of an overlay mark in a current layer and a top of an overlay mark in a pre-layer are detected during the examination. However, a distance between the top of the overlay mark in the current layer and the top of the overlay mark in the pre-layer may be greater than a depth of field (DOF) of a detector, or a thickness of one or more interlayers between the two overlay marks may be greater than the DOF of the detector. Thus, the overlay mark in the pre-layer may not be clearly or precisely detected. The present disclosure provides a structure of an overlay mark (e.g., the first pattern 21 in FIG. 13) that includes a photoluminescent or fluorescent material, and detection of the overlay mark in the pre-layer can be accurately obtained even if the distance H7 is greater than the DOF of the detector.

Figure 14:
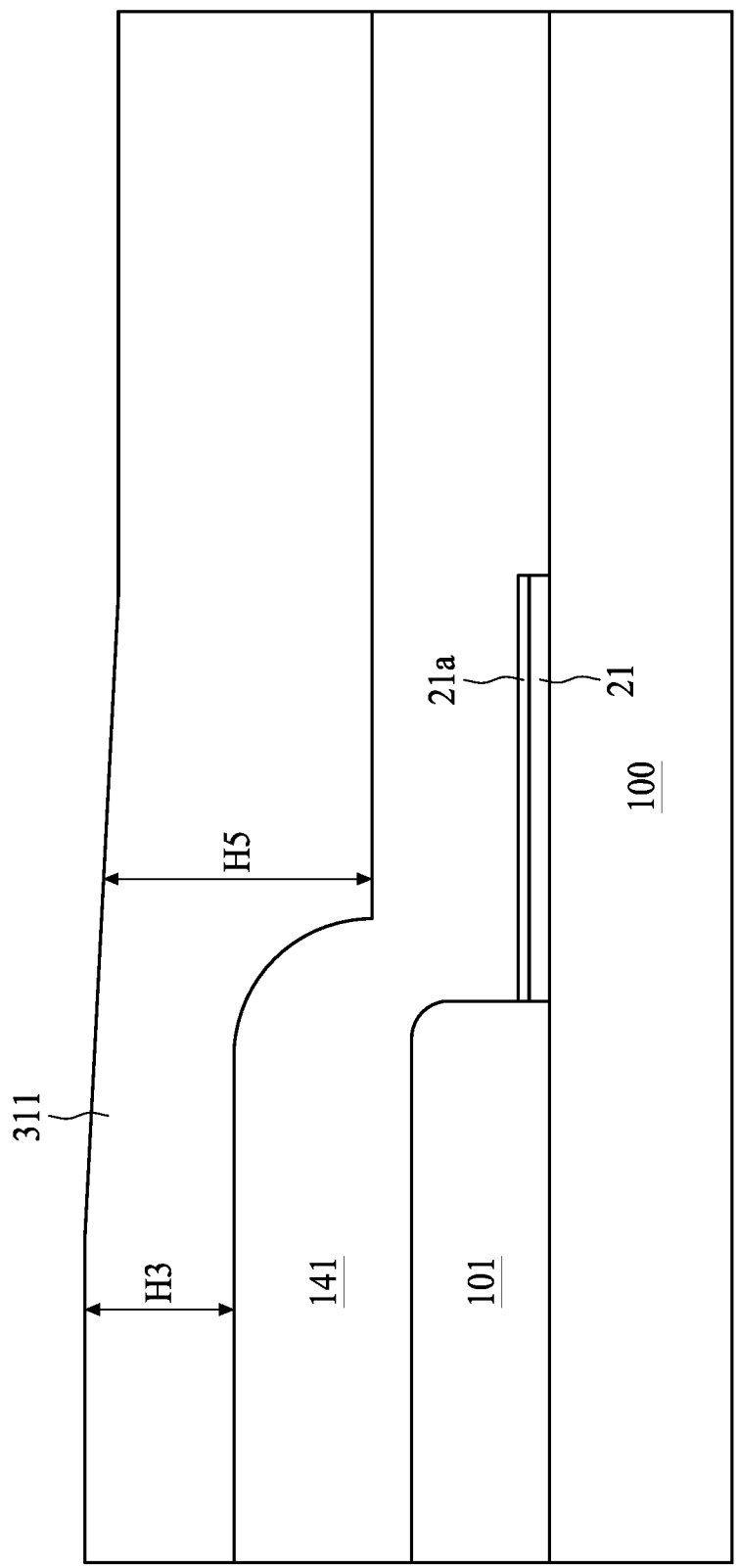

FIG. 14 is a cross-sectional diagram taken along a cutting line C-C' of FIG. 3 or a cutting line D-D' of FIG. 4 at a different stage of the method S1 in accordance with some embodiments of the present disclosure. According to the operations S11 to S13 and formation of a mask layer 311, in some embodiments, an intermediate structure is formed as shown in FIG. 14.

Figure 15:
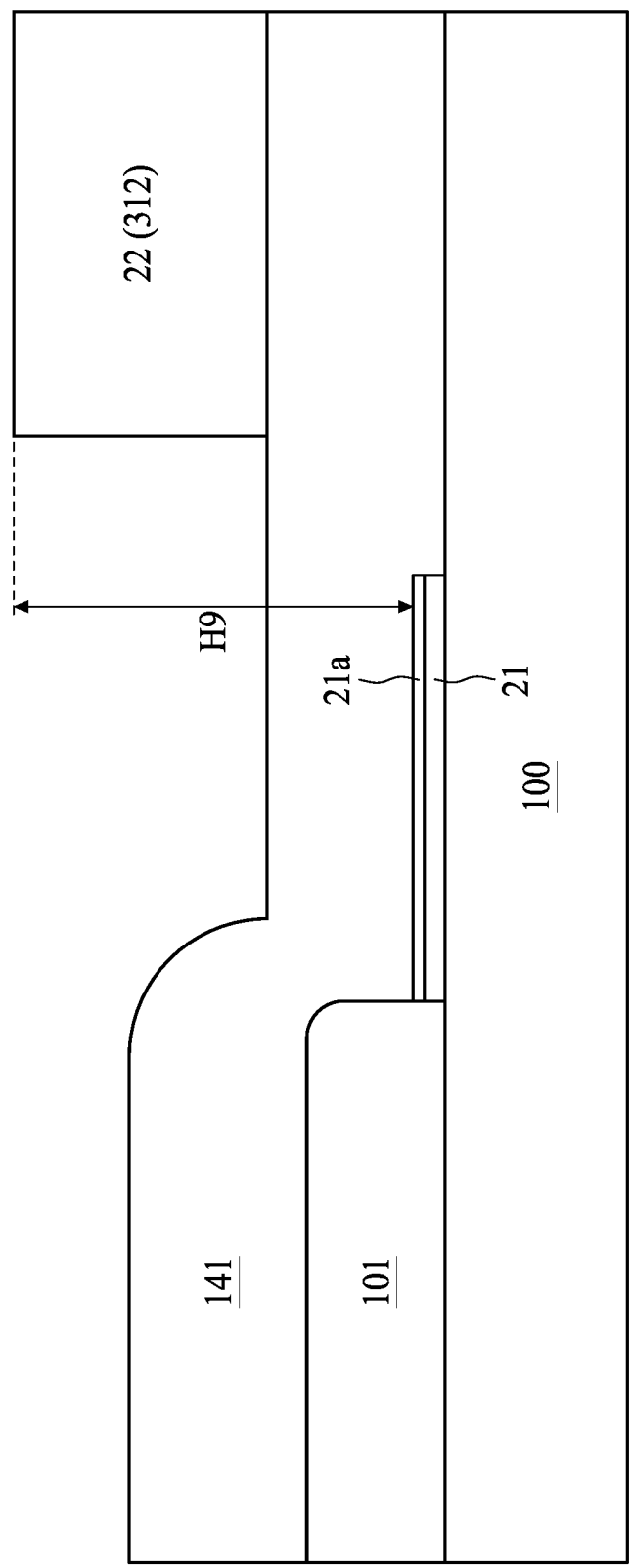

FIG. 15 is a cross-sectional diagram taken along the cutting line C-C' of FIG. 3 or the cutting line D-D' of FIG. 4 at a different stage of the method S1 in accordance with some embodiments of the present disclosure. In the operation S14, the mask layer 311 is patterned to form a patterned mask layer 312. In some embodiments, an exposure and a developing operation are performed on the mask layer 311, and portions of the mask layer 311 are then removed to form the patterned mask layer 312. In some embodiments, an etching operation is performed to remove the portions of the mask layer 311. In some embodiments, a configuration of at least a portion of a pattern of the patterned mask layer 312 from a top view perspective is similar to that of the overlay mark 22 as shown in FIG. 3 or FIG. 4. In some embodiments, the photoluminescent layer 21a or the first pattern 21 is exposed through the patterned mask layer 312 from a top view perspective. In some embodiments, the photoluminescent layer 21a or the first pattern 21 is surrounded by at least a portion of the patterned mask layer 312 from the top view perspective, wherein the portion of the patterned mask layer 312 functions as an overlay mark. In some embodiments, the photoluminescent layer 21a or the first pattern 21 is encircled by the portion of the patterned mask layer 312 from the top view perspective.

The portion of the patterned mask layer 312 that functions as an overlay mark can be also referred to as a second pattern 22. In some embodiments, a distance H9 between a top of the second pattern 22 and the top of the first pattern 21 is substantially equal to the distance H7. In some embodiments, the distance H9 is greater than the DOF of the detector. In some embodiments, the distance H9 is greater than 5.7 microns.

Figure 16:
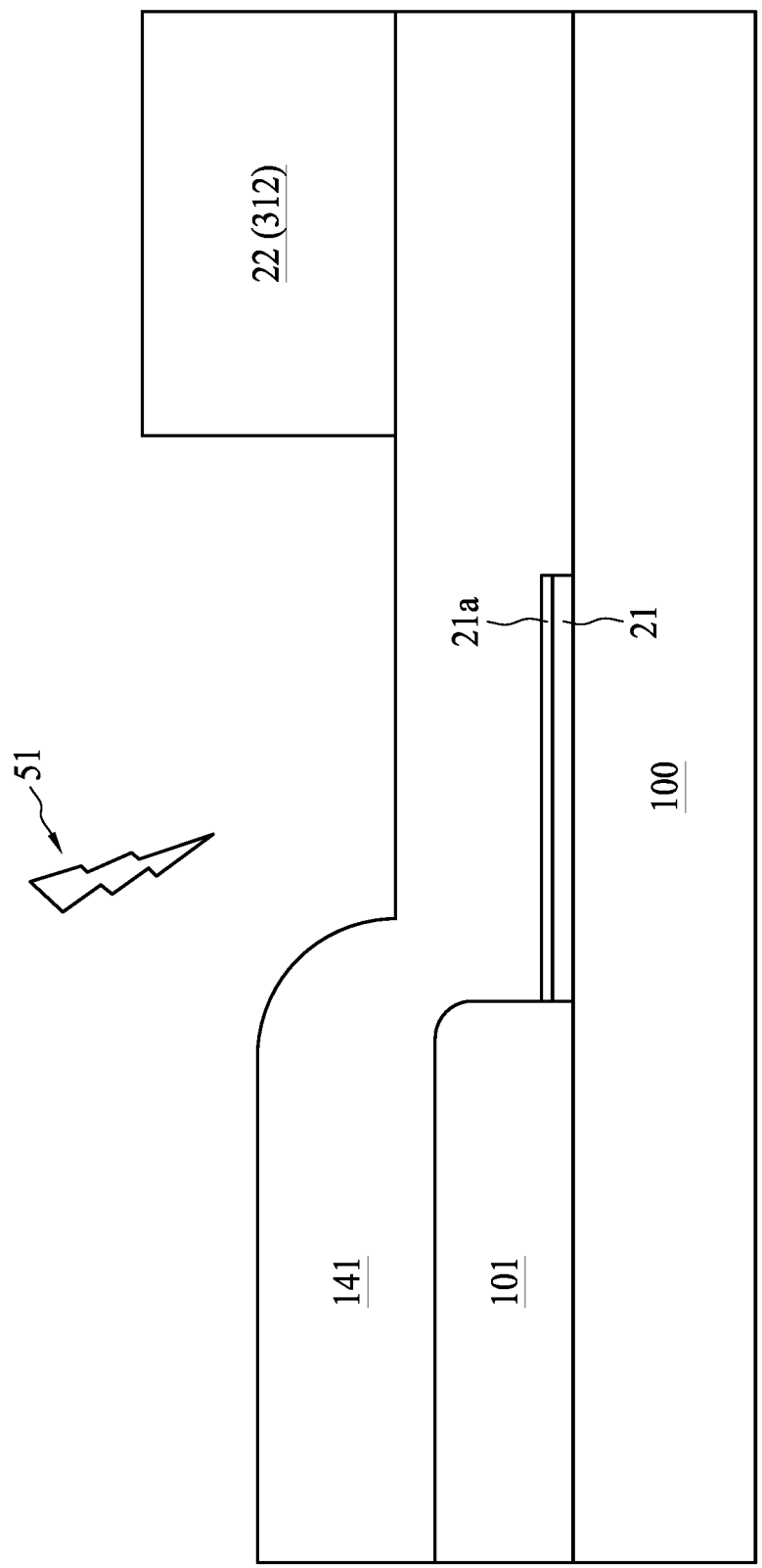

FIG. 16 is a cross-sectional diagram taken along the cutting line C-C' of FIG. 3 or the cutting line D-D' of FIG. 4 at a different stage of the method S1 in accordance with some embodiments of the present disclosure. In the step S151 of the operation S15, a first optical signal 51 is provided on the photoluminescent layer 21a of the first pattern 21. In some embodiments, the first optical signal 51 is provided across the whole wafer 10. In some embodiments, the first optical signal 51 is provided in both the scribe line region 30 and the device region 40. In some embodiments, the first optical signal 51 is provided only on the photoluminescent layer 21a. A wavelength of the first optical signal 51 can be within a range of wavelengths of near infrared (NIR), far infrared (FIR), ultraviolet (UV), near UV (NUV), far UV (FUV), green light, yellow light, red light, or a combination thereof. In some embodiments, the first optical signal 51 is provided on the entire substrate 100. The photoluminescent or fluorescent material of the photoluminescent layer 21a can be excited by the first optical signal 51. Electrons of the excited photoluminescent or fluorescent material return to ground states from excited states, and radiation is emitted on the return of the electrons to the ground state.

Figure 17:
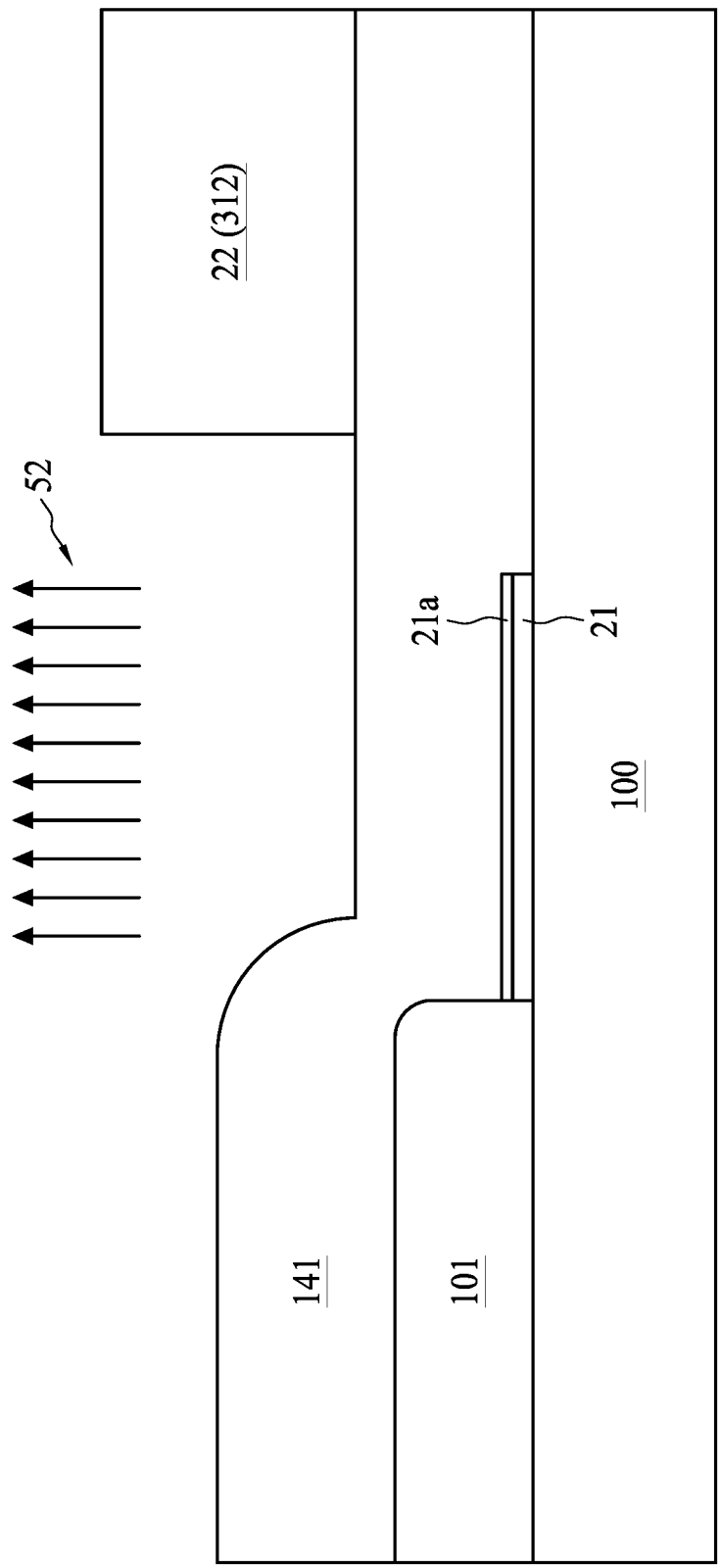

FIG. 17 is a cross-sectional diagram taken along the cutting line C-C' of FIG. 3 or the cutting line D-D' of FIG. 4 at a different stage of the method S1 in accordance with some embodiments of the present disclosure. In the step S152 of the operation S15, a second optical signal 52 is received by a detector. In some embodiments, the second optical signal 52 is a result of radiation relaxation of the excited photoluminescent layer 21a. In some embodiments, the second optical signal 52 is the radiation emitted by the photoluminescent layer 21a. In some embodiments, the second optical signal 52 is visible radiation. In some embodiments, the second optical signal 52 is non-visible radiation. The second optical signal 52 is processed by a system of the present disclosure to determine a position of the first pattern 21 in the steps S153 to S154 and the step S158, and such system is illustrated in the following description.

Figure 18:
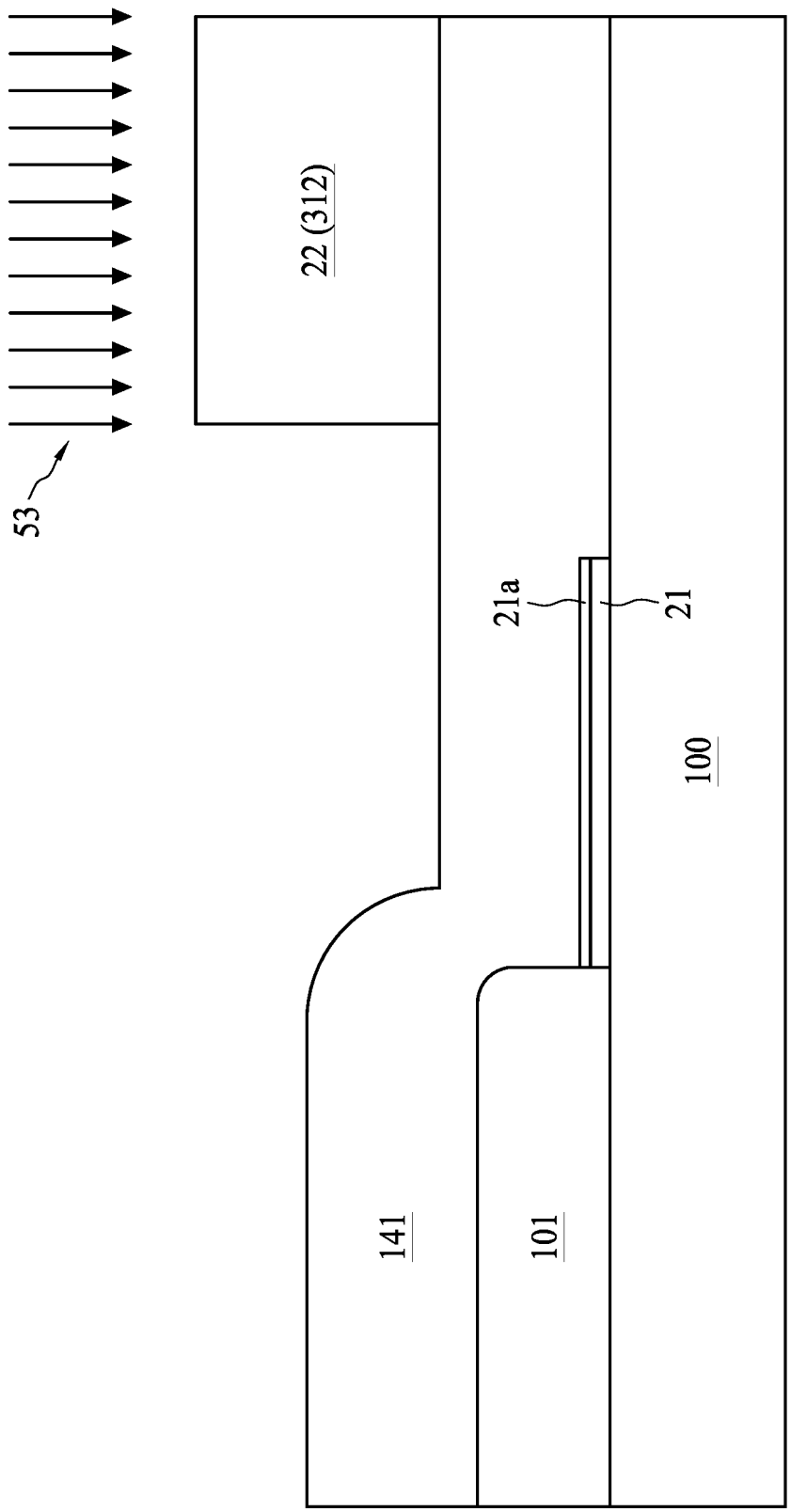

FIG. 18 is a cross-sectional diagram taken along the cutting line C-C' of FIG. 3 or the cutting line D-D' of FIG. 4 at a different stage of the method S1 in accordance with some embodiments of the present disclosure. In the step S155 of the operation S15, a third optical signal 53 is provided on the second pattern 22 of the patterned mask layer 312. In some embodiments, the third optical signal 53 is provided across the whole wafer 10. In some embodiments, the third optical signal 53 is provided in the scribe line region 30 of the wafer 10. In some embodiments, the third optical signal 53 is provided only on the second pattern 22. The third optical signal 53 can be visible radiation or non-visible radiation. A wavelength of the third optical signal 53 can be within a range of wavelengths of near infrared (NIR), far infrared (FIR), ultraviolet (UV), near UV (NUV), far UV (FUV), green light, yellow light, red light, or a combination thereof. Part or all of the third optical signal 53 on the second pattern 22 is reflected as a feedback signal.

Figure 19:
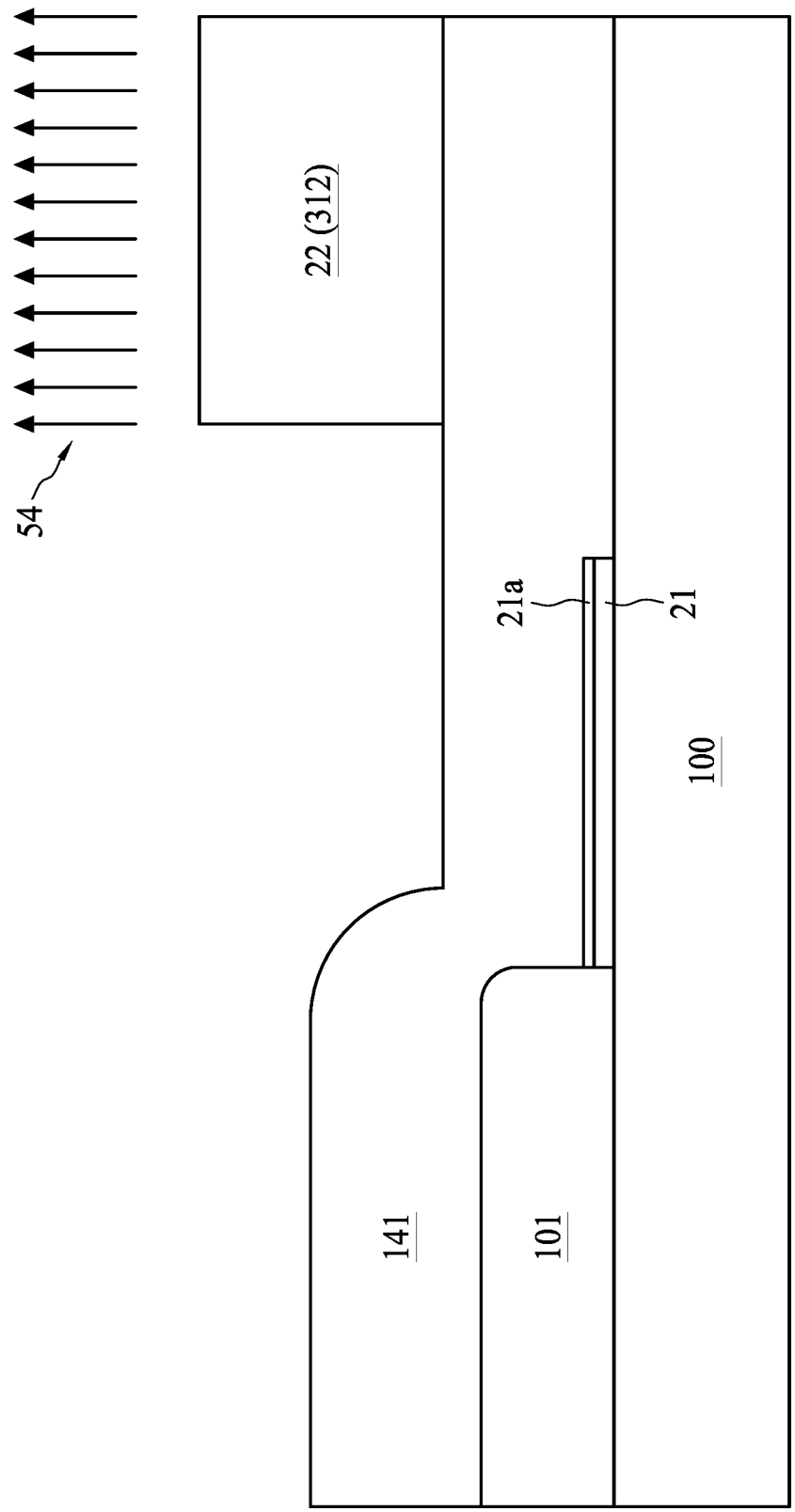

FIG. 19 is a cross-sectional diagram taken along the cutting line C-C' of FIG. 3 or the cutting line D-D' of FIG. 4 at a different stage of the method S1 in accordance with some embodiments of the present disclosure. In the step S156 of the operation S15, a fourth optical signal 54 is received. In some embodiments, the fourth optical signal 54 is the reflection or the feedback signal from the second pattern 22. The fourth optical signal 54 is processed by the system of the present disclosure to determine a position of the second pattern 22 in the steps S157 to S158 of the operation S15, and such system is illustrated in the following description. In some embodiments, the second optical signal 52 and the fourth optical signal 54 are combined to examine an alignment of the first pattern 21 and the second pattern 22. If the alignment is precise, the method proceeds to a subsequent operation; alternatively, if the first pattern 21 and the second pattern 22 are misaligned, the patterned mask layer 312 may be removed and formation and patterning of a mask layer (i.e., the operation S14) are repeated.

Figure 20:
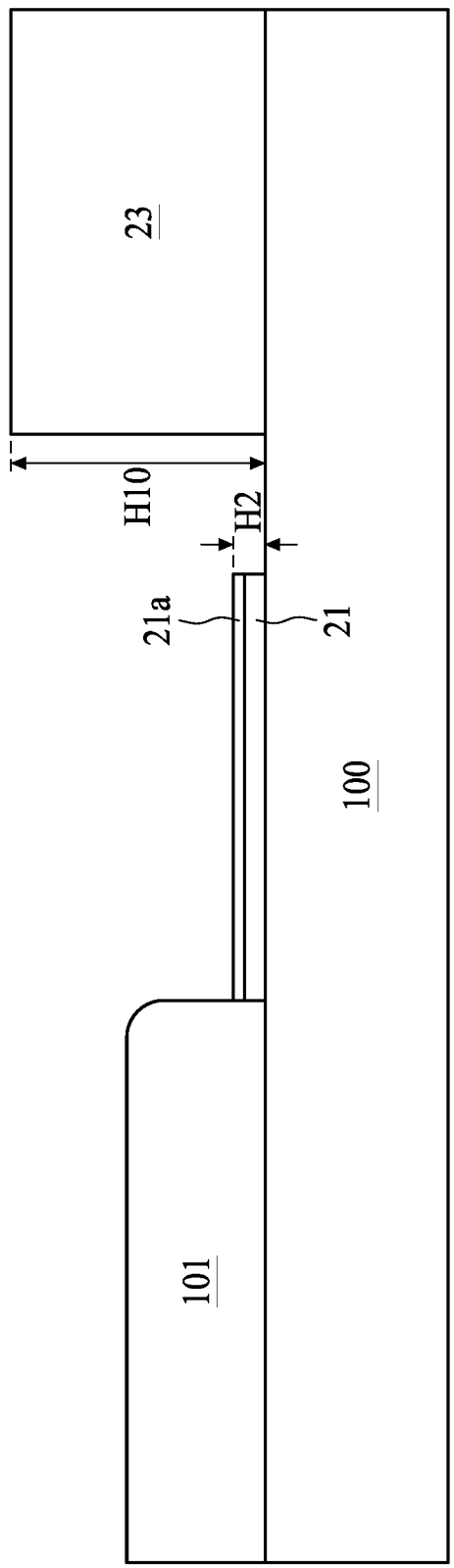

FIG. 20 is a cross-sectional diagram taken along the cutting line C-C' of FIG. 3 or the cutting line D-D' of FIG. 4 at a different stage of the method S1 in accordance with some embodiments of the present disclosure. After the operation S15, the method S1 further includes transferring the pattern of the patterned mask layer 312 to the intermediate layer 141 to form a third pattern 23. In some embodiments, the third pattern 23 is disposed in the scribe line region 30. In some embodiments, the third pattern 23 is disposed in the device region 40. In some embodiments, the third pattern 23 is disposed at a corner of the device region 40. In some embodiments, the third pattern 23 has a configuration similar to that of the overlay mark 22 in FIG. 3 or that of the overlay mark 22 in FIG. 4. In some embodiments, the third pattern 23 is disposed at a same elevation as the first pattern 21. In some embodiments, a thickness H10 of the third pattern 23 is greater than the thickness H2 of the first pattern 21.

The present disclosure provides a method that includes formation of a photoluminescent layer on an overlay mark of a pre-layer for a better detection of alignment between the overlay mark of the pre-layer and a current layer. A precise position of the overlay mark of the pre-layer can be detected even if a distance between tops of the overlay marks of the pre-layer and the current layer is greater than a depth of field of a detector. The photoluminescent layer can be formed at a bottom or on a top of the overlay mark. In addition, the photoluminescent layer includes a photoluminescent or fluorescent material that can withstand temperatures equal to or greater than 375° C., and thus the photoluminescent layer can be easily applied in a conventional semiconductor manufacturing process. It should be noted that the photoluminescent layer of the present disclosure can be applied in an overlay mark of any layer of a semiconductor structure that requires an alignment examination.

In order to perform the method S1, especially the detection of the operation S15 for alignment examination, the disclosure provides a system for forming a semiconductor structure.

Figure 21:
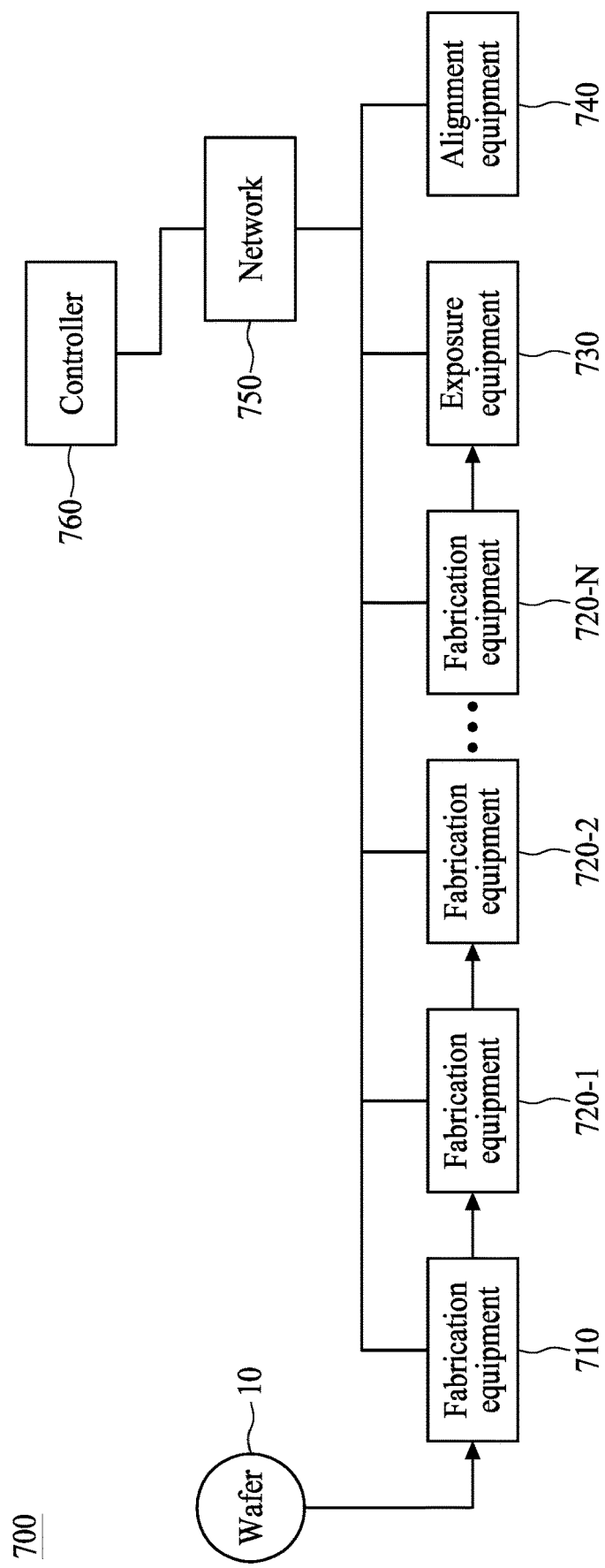
FIG. 21 is a block diagram of a semiconductor fabrication system in accordance with some embodiments of the present disclosure.

FIG. 21 is a block diagram illustrating a semiconductor fabrication system 700, in accordance with some embodiments of the present disclosure.

The semiconductor fabrication system 700 can include a plurality of fabrication equipment 710, 720-1, 720-2, . . . , and 720-N, an exposure equipment 730, and an alignment equipment 740. The fabrication equipment 710, 720-1, 720-2, . . . , and 720-N, the exposure equipment 730, and the alignment equipment 740 can be coupled to a controller 760 through a network 750.

The fabrication equipment 710 can be configured to perform operations in order to form a layer or a structure on a wafer 10. In some embodiments, the fabrication equipment 710 may be configured to form an isolation structure, a gate structure, and conductive layers of a semiconductor structure. The fabrication equipment 720-1, 720-2, . . . , and 720-N can be configured to form layers, such as the first pattern 21, the intermediate layer 141, the photoluminescent layer 21a, and the mask layer 312 shown in FIGS. 10 to 20. Each piece of the fabrication equipment 720-1, 720-2, . . . , and 720-N can be configured to perform a deposition process, an etching process, a chemical mechanical polishing process, a photoresist coating process, a baking process, an alignment process, or other processes.

The exposure equipment 730 can be configured to perform patterning operations to form, for instance, the first pattern 21, the second pattern 22 and the third pattern 23 as shown in FIGS. 10 to 20.

The alignment equipment 740 can be configured to generate an alignment result of two overlay marks at different elevations. The alignment equipment 740 can be configured to obtain an optical image of a pattern (e.g., the first pattern 21) of a pre-layer and a pattern (e.g., the second pattern 22) of a current layer, and to generate an alignment result based on the aforesaid optical images of the patterns of the pre-layer and the current layer.

The network 750 can be the internet or an intranet implementing network protocols such as transmission control protocol (TCP). Through the network 750, each of the fabrication equipment 710, 720-1, 720-2, . . . , and 720-N, the exposure equipment 730 and the alignment equipment 740 may download or upload work in progress (WIP) information regarding the wafer 10 or the fabrication equipment from or to the controller 760. In some embodiments, each of the fabrication equipment 710, 720-1, 720-2, . . . , and 720-N, the exposure equipment 730 and the alignment equipment 740 is electrically connected to the network 750. In some embodiments, each of the fabrication equipment 710, 720-1, 720-2, . . . , and 720-N, the exposure equipment 730 and the alignment equipment 740 is wirelessly connected to the network 750.

The controller 760 is configured to control the fabrication of the semiconductor structure or the wafer 10. The controller 760 can be electrically or wirelessly connected to each of the fabrication equipment 710, 720-1, 720-2, . . . , and 720-N, the exposure equipment 730 and the alignment equipment 740. A position and status of the wafer 10 can be sent to the controller 760. The controller 760 can include a processer, such as a central processing unit (CPU). In some embodiments, the controller 760 can generate an alignment result based on data from the alignment equipment 740. In some embodiments, the alignment result is generated by another controller in the alignment equipment 740, and the controller 760 can receive the alignment result from the alignment equipment 740. In some embodiments, the controller 760 can proceed the fabrication of the wafer 10 to a next stage of the method if the alignment result is positive or the alignment is precise.

In the exemplary embodiments, a wafer 10 is transferred to the fabrication equipment 710 to start a sequence of different processes. The wafer 10 may be processed according to various stages of the method to form at least one layer of material. The exemplary embodiments are not intended to limit the processes performed on the wafer 10. In other exemplary embodiments, the wafer 10 may include various layers, and any stages of the method may be performed between a beginning and a completion of a product, before the wafer 10 is transferred to the fabrication equipment 710. In the exemplary embodiments, the wafer 10 can be processed by the fabrication equipment 710, 720-1, 720-2, . . . , and 720-N, the exposure equipment 730 and the alignment equipment 740 in a sequential order.

Although FIG. 21 does not show any fabrication equipment before the fabrication equipment 710, the exemplary embodiment is not intended to be limiting. In other exemplary embodiments, various kinds of fabrication equipment can be utilized before the fabrication equipment 710, and can be used to perform various processes according to design requirements.

The alignment equipment 740 can include several units or components. In some embodiments, the alignment equipment 740 is referred to as an alignment examination system 740.

Figure 22:
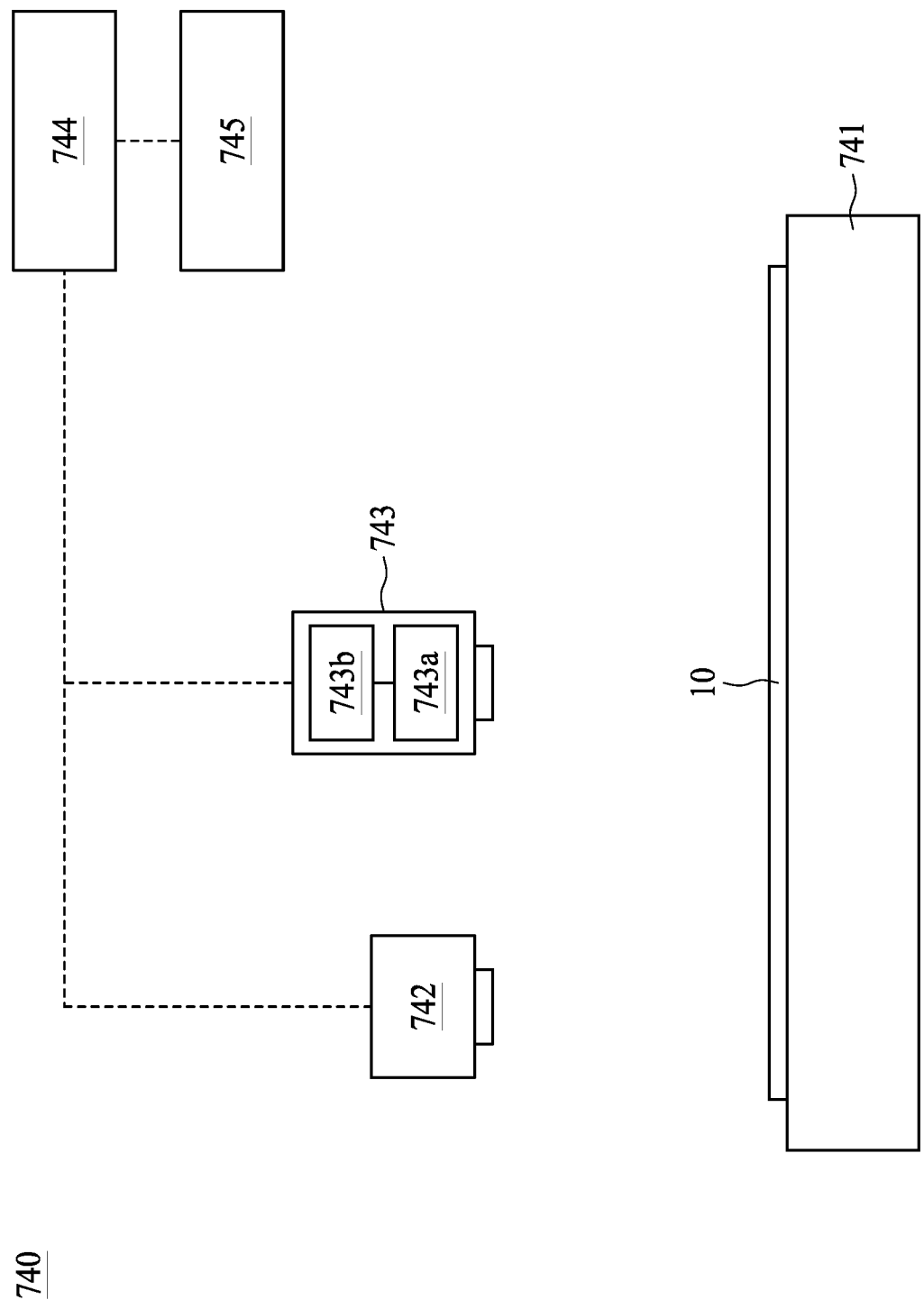
FIG. 22 is a schematic diagram of an alignment equipment of the semiconductor fabrication system shown in FIG. 21 in accordance with some embodiments of the present disclosure.

FIG. 22 is a schematic diagram of the alignment equipment 740 in accordance with some embodiments of the present disclosure. In some embodiments, the alignment equipment 740 includes a stage 741, an optical device 742, a detecting unit 743, a controller 744, and an interface 745.

The stage 741 may be configured to support a wafer 10 to undergo an alignment detection and/or an alignment examination. In some embodiments, the wafer 10 is transferred to the alignment equipment 740 after the operation S16 for performing the operation S17. In some embodiments, the wafer 10 is transferred from the exposure equipment 730 or one of the fabrication equipment 720-1 to 720-N. In some embodiments, the wafer 10 is transferred into the alignment equipment 740 and disposed on the stage 741.

The optical device 742 may be configured to emit a radiation or an optical signal for exciting a photoluminescent material of an overlay mark in a scribe line region 30 of the wafer 10. In some embodiments, the radiation is the first optical signal 51 shown in FIG. 16. In some embodiments, the radiation is provided on the photoluminescent material of the overlay mark of a pre-layer in a scribe line region 30. In some embodiments, the radiation is provided in both the scribe line region 30 and a device region 40. In some embodiments, the radiation is provided on the entire wafer 10. A wavelength of the radiation can be within a range of near infrared (NIR), far infrared (FIR), ultraviolet (UV), near UV (NUV), far UV (FUV), green light, yellow light, red light, or a combination thereof. The photoluminescent material is excited by the radiation. Electrons of the excited photoluminescent material return to ground states from excited states, and a radiation is emitted on the return of the electrons to the ground state.

The detecting unit 743 is configured to detect the radiation emitted from the photoluminescent material of the overlay mark on the wafer 10. In some embodiments, the detecting unit 743 includes an optical filter 743a and an optical detector 743b. The optical filter 743a may be configured to receive and filter the radiation emitted from the photoluminescent material, and the optical detector 743b may be configured to convert an optical signal filtered by the optical filter to an electrical signal.

Figure 23:
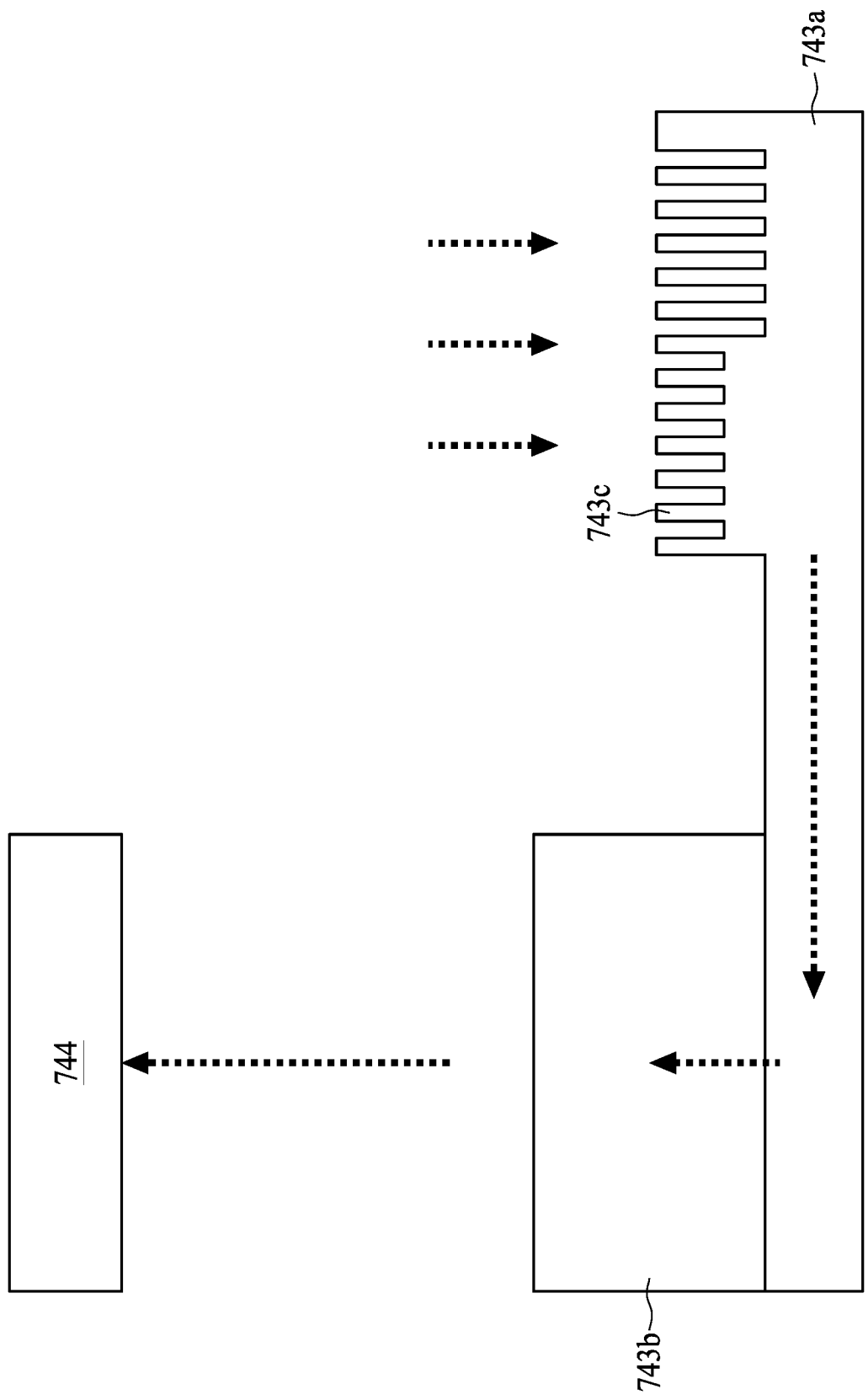
FIG. 23 is a schematic diagram of a detecting unit of the alignment equipment shown in FIG. 22 in accordance with some embodiments of the present disclosure.

FIG. 23 is a schematic diagram of the optical unit 743 in accordance with some embodiments of the present disclosure. In some embodiments, the optical filter 743a is a waveguide. In some embodiments, the optical filter 743a includes a grating structure 743c. The grating structure 743c allows the radiation to enter therethrough. In some embodiments, the grating structure 743c includes different depths of grating units. In some embodiments as shown in FIG. 23, the grating structure 743c includes two grating units having two different depths. However, the disclosure is not limited thereto. In some embodiments, the grating structure 743c can include one or more grating units. In some embodiments, the one or more grating units can include different depths. In some embodiments, the grating structure 743c includes a semiconductive material. In some embodiments, the grating structure 743c is formed in a semiconductor substrate.

The radiation emitted from the photoluminescent material of the overlay mark on the wafer 10 is received by the optical filter 743a. The radiation may enter the grating structure 743c and travel within the semiconductive material of the optical filter 743a. The radiation can be redirected and transmitted to the optical detector 743b. In some embodiments, the optical filter 743a and the optical detector 743b are formed in a same semiconductor substrate. In some embodiments, the optical detector 743b and the optical filter 743a are two semiconductor devices bonded on a same substrate. In some embodiments, the optical filter 743a and the optical detector 743b are included in a same semiconductor package. The radiation or optical signal from the optical filter 743a is received and converted to an electrical signal by the optical detector 743b. The electrical signal is output from the optical detector 743b and sent to the controller 744, and a data of the overlay mark having the photoluminescent material is generated.

In some embodiments, the radiation required for excitation of the photoluminescent material has a wavelength different from a wavelength of the radiation emitted as a result of the relaxation of the electrons of the photoluminescent material. In some embodiments, a filtration range of wavelengths of the optical filter 743a is different from a range of wavelengths of radiation generated by the optical device 742. A wavelength of the radiation generated by the optical device 742 can be adjusted according to the photoluminescent material. The filtration range of the wavelengths of the optical filter 743a can also be adjusted according to the photoluminescent material. In some embodiments, the grating structure 743c of the optical filter 743a includes different depths for filtering different ranges of wavelengths of radiations. The different radiations are converted into different electrical signals by the optical detector 743b, and the electrical signals can then be processed and categorized by the controller 744. In some embodiments, only the electrical signals corresponding to a desired range of wavelengths are used in an alignment result.

Referring back to FIG. 22, the controller 744 can be electrically or wirelessly connected to the optical device 742 and the detecting unit 743. The controller 744 can be configured to process the electrical signal from the optical detector 743b of the detecting unit 743. In some embodiments, the controller 744 receives the electrical signal from the detecting unit 743. The electrical signal is processed by the controller 744 to generate a data showing a position of the overlay mark in the scribe line region 30 on the wafer 10.

In some embodiments, the controller 744 can include a processer, such as a central processing unit (CPU). In some embodiments, the controller 744 is a logic device. In some embodiments, the data can be displayed on the interface 745. The interface 745 can be electrically or wirelessly connected to the controller 744.

In some embodiments, the optical device 742 generates another radiation targeting a different overlay mark (e.g., in the current layer). The process as illustrated above is repeated on the different overlay mark. A data of the different overlay mark can be generated and combined with the overlay mark (e.g., in the pre-layer) detected previously. An alignment result can then be generated by the controller 744 by combining and processing the two data of the two different overlay marks at different elevations. In some embodiments, the alignment equipment 740 does not have a controller. In some embodiments, the electrical signal output from the detecting unit 743 is transmitted to the controller 760 shown in FIG. 21. The controller 760 can function like the controller 744 to process the electrical signal and generate an alignment result.

One aspect of the present disclosure provides a method of forming a semiconductor structure. The method includes forming a first pattern over a substrate; forming a photoluminescent layer on the first pattern; forming an intermediate layer over the photoluminescent layer and the substrate; forming a patterned mask layer on the intermediate layer; and detecting an alignment of the patterned mask layer with the first pattern.

Another aspect of the present disclosure provides a system for forming a semiconductor structure. The system includes: a fabrication equipment, configured to perform operations to form a layer on a wafer; an exposure equipment, configured to perform patterning operations to form a pattern of the layer; and an alignment equipment, configured to detect an alignment of two overlay marks at different elevations. The alignment equipment comprises: a stage, configured to support a semiconductor structure; an optical device, configured to emit a radiation to excite a photoluminescent material of an overlay mark in a scribe line region of the semiconductor structure; an optical filter, configured to receive and filter a radiation emitted from the photoluminescent material; and an optical detector, configured to convert an optical signal filtered by the optical filter to an electrical signal.

Another aspect of the present disclosure provides a semiconductor structure. The semiconductor structure includes: a capacitor, disposed over a substrate; an overlay mark, disposed adjacent to and at a same elevation as the capacitor; a photoluminescent layer, disposed on the overlay mark; and an intermediate layer, disposed over the capacitor and the photoluminescent layer.

In conclusion, the application discloses a semiconductor structure, a method for forming the semiconductor structure, and a system for performing the method. A photoluminescent layer is included in an overlay mark, and a detection of the overlay mark of a pre-layer is improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A system for manufacturing a semiconductor structure, comprising:
   fabrication equipment, configured to form a first overlay mark and a second overlay mark on two different layers of a wafer respectively and to form a photoluminescent layer only on the first overlay mark, wherein the two different layers of the wafer are positioned at different elevations, wherein the photoluminescent layer is made of a photoluminescent material; and
   alignment equipment, configured to detect an alignment of the first overlay mark and the second overlay mark at different elevations on the wafer, the alignment equipment comprising:
   a stage, configured to support the wafer;
   an optical device, configured to emit a first radiation on the photoluminescent layer to excite the photoluminescent material of the photoluminescent layer on the first overlay mark;
   an optical filter, configured to receive and filter a second radiation emitted from the photoluminescent material, wherein the second radiation emitted from the photoluminescent material is a result of radiation relaxation of the photoluminescent layer after the photoluminescent layer is excited;
   an optical detector, configured to convert the second radiation as a resulted optical signal filtered by the optical filter to an electrical signal; and
   a controller configured to generate an alignment result of the first overlay mark and the second overlay mark generated based on the electrical signal from the optical detector.

2. The system of claim 1, wherein the optical device is further configured to generate a first optical signal on the second overlay mark.

3. The system of claim 1, wherein the optical filter includes a grating structure for the radiation entering through.

4. The system of claim 1, wherein a filtration range of wavelengths of the optical filter is different from a range of wavelengths of radiation emitted from the optical device.

5. The system of claim 1, wherein the optical detector is electrically or physically connected to the optical filter.

6. The system of claim 1, wherein the optical device emits the radiation having a wavelength in a range of near infrared (NIR), far infrared (FIR), ultraviolet (UV), near UV (NUV), far UV (FUV), green light, yellow light, red light, or a combination thereof.

7. The system of claim 1,
   wherein the controller is electrically or wirelessly connected to the optical device and the optical detector, and configured to process the electrical signal from the optical detector.

8. The system of claim 7, wherein the alignment equipment further comprises:

an interface, electrically connected to the controller and configured to display a result of the electrical signal after processing by the controller.

* * * * *